(12) United States Patent
Li et al.

(10) Patent No.: US 12,431,884 B2
(45) Date of Patent: Sep. 30, 2025

(54) DATA COMMUNICATION LINK WITH CAPACITOR-BASED PUMPED OUTPUT

(71) Applicant: BLUE CHEETAH ANALOG DESIGN INC., Sunnyvale, CA (US)

(72) Inventors: Ka Yiu Li, Santa Clara, CA (US); Eric Naviasky, Ellicott City, MD (US); Elad Alon, Orinda, CA (US)

(73) Assignee: Blue Cheetah Analog Design, Inc.

(*) Notice: Subject to any disclaimer, the term of this patent is extended or adjusted under 35 U.S.C. 154(b) by 0 days.

(21) Appl. No.: 18/158,858

(22) Filed: Jan. 24, 2023

(65) Prior Publication Data

US 2024/0250677 A1     Jul. 25, 2024

(51) Int. Cl.
| | |
|---|---|
| H03K 19/017 | (2006.01) |
| G11C 5/14 | (2006.01) |
| H02M 3/07 | (2006.01) |
| H03K 17/06 | (2006.01) |
| H03K 19/00 | (2006.01) |
| H03K 19/17736 | (2020.01) |

(52) U.S. Cl.
CPC ............. *H03K 17/06* (2013.01); *G11C 5/145* (2013.01); *H02M 3/075* (2021.05); *H03K 19/0005* (2013.01); *H03K 19/01714* (2013.01); *H03K 19/1774* (2013.01)

(58) Field of Classification Search
None
See application file for complete search history.

(56) References Cited

U.S. PATENT DOCUMENTS

| | | | |
|---|---|---|---|
| 5,592,370 A | 1/1997 | Rogers | |
| 5,594,380 A * | 1/1997 | Nam | H03K 19/01714 |
| | | | 326/88 |
| 5,729,165 A * | 3/1998 | Lou | H03K 19/01714 |
| | | | 326/88 |
| 5,831,845 A | 11/1998 | Zhou et al. | |

(Continued)

FOREIGN PATENT DOCUMENTS

| | | |
|---|---|---|
| CN | 106645893 A | 5/2017 |
| CN | 208143090 U | 11/2018 |

OTHER PUBLICATIONS

Huang et al. "Low-Ripple and Dual-Phase Charge Pump Circuit Regulated by Switched Capacitor-Based Bandgap Reference." IEEE Transactions on Power Electronics, vol. 24, No. 5 (May 2009), pp. 1161-1172. doi: 10.1109/TPEL.2008.2010546.

*Primary Examiner* — Thomas J. Hiltunen
(74) *Attorney, Agent, or Firm* — Daylight Law, P.C.

(57) ABSTRACT

A data transmitter high side switch includes at least one output unit, an input logic unit, a reset circuit coupled to the input logic unit, a capacitor pump circuit coupled to the reset circuit and the input logic circuit, and operatively to the at least one output unit. The capacitor pump circuit includes at least one capacitor that is charged in a first direction during a time period when the input data signal is in a first logic level. During a subsequent time period, when the input data signal is in a second logic level, a reference voltage for the charge on the capacitor is changed to thereby provide an overdrive level turn-on voltage to a corresponding output transistor of the at least one output unit. The charge of the at least one capacitor can be adjustably selected to compensate for tolerance variations and/or ambient conditions to control output impedance.

17 Claims, 8 Drawing Sheets

(56) References Cited

U.S. PATENT DOCUMENTS

| | | | |
|---|---|---|---|
| 5,940,333 A | | 8/1999 | Chung |
| 6,072,354 A | * | 6/2000 | Tachibana ........ H03K 19/01714 |
| | | | 326/88 |
| 6,242,973 B1 | * | 6/2001 | Kong ................... G11C 7/1078 |
| | | | 327/390 |
| 6,356,137 B1 | | 3/2002 | Roohparvar et al. |
| 6,518,829 B2 | | 2/2003 | Butler |
| 6,538,466 B1 | | 3/2003 | Lovett |
| 6,850,089 B2 | * | 2/2005 | Huang ............. H03K 19/01707 |
| | | | 326/88 |
| 6,859,083 B1 | | 2/2005 | Xin-Leblanc et al. |
| 7,230,454 B2 | | 6/2007 | Welser et al. |
| 7,292,075 B2 | * | 11/2007 | Abdel-Hamid ............................. |
| | | | H03K 19/00384 |
| | | | 327/108 |
| 7,973,564 B1 | * | 7/2011 | Chuang ............ H03K 17/04123 |
| | | | 326/88 |
| 8,258,847 B2 | * | 9/2012 | Kimura ............ H03K 19/01855 |
| | | | 327/318 |
| 8,384,460 B1 | | 2/2013 | Sung et al. |
| 9,065,433 B2 | | 6/2015 | Sinha et al. |
| 9,368,526 B2 | * | 6/2016 | Kimura .......... H03K 19/018521 |
| 2003/0184337 A1 | * | 10/2003 | Huang ............. H03K 19/01707 |
| | | | 326/26 |
| 2005/0258458 A1 | | 11/2005 | Wang et al. |
| 2015/0381162 A1 | | 12/2015 | Wang |

\* cited by examiner

DATA COMMUNICATION LINK WITH CAPACITOR-BASED PUMPED OUTPUT

FIELD OF THE INVENTION

The present invention is directed to the area of digital data communication, and particularly to high-speed data links, such as, for example, high-speed board-level and chip-level data transmitters.

More specifically, the present invention is directed to a high-speed data transceiver with an improved Source-Series Terminated (SST) output driver capable of providing conditions for the transceiver's improved operation with no additional power supplies.

In particular, the present invention addresses the transmitter in a data link, where an output drive logic is driven with a capacitor-based pump circuit providing a full or overdrive gate drive voltage to output transistors to fully turn them ON and OFF for efficient operation of the data transmitter.

The present invention is also directed to a Source-Series Terminated (SST) output driver in a transmitter having a miniature design and optimized operation, where the level shift of the voltage does not impose a bandwidth limitation or cause distortions.

Still further, the present invention is directed to an SST output driver wherein the gate drive voltages of the output transistors are precisely controlled to control their output impedance so as to reduce the resistance of the circuit output resistor, and thereby save chip area and power.

Further yet, the present invention is directed to the SST output driver wherein the output impedance thereof is controlled to compensate for process, voltage, and temperature variations.

BACKGROUND OF THE INVENTION

In data communication, transceivers for high-speed data transmissions which have a sufficient power efficiency to provide a reasonably low power consumption at an enhanced bandwidth are in demand. In high-speed transceivers, one of the power demanding blocks in the transmitter is the output driver.

One of the output drivers used in contemporary high-speed serial transceivers is a Current-Mode Logic (CML) driver which can operate at high data rates with a sufficient power supply noise resistance. However, the power efficiency of the CML drivers is disadvantageously low due to the on-chip termination and pull-only driver topology. Also, in sub-30-nm complementary metal-oxide semiconductor (CMOS) technologies it is difficult for CML drivers to operate at high speed due to the reduced voltage headroom for the stack of two transistors operating in the saturation region.

A better option for a high-speed serial transceiver is a Source-Series Terminated (SST) driver which consumes a lower power than is required for the CML operation because termination resistors are inserted in series, rather than in parallel, with the driver output and use of a push-pull topology. In theory, the power consumption of the SST driver is ¼ of the CML driver with the same output swing. This makes the SST driver attractive in low power transmitted design.

As depicted in a schematic representation of a conventional SST output driver in FIG. 1, an output stage 10 in a high-speed data transmitter includes an output unit 12. The output unit 12 may actually be a number of output units that are connected in parallel, and are controlled by a drive logic 14. The drive logic 14 may be an individual circuit for each output unit 12 or may control a number of the parallel output units 12.

The output unit 12 includes a P channel output transistor P1, an N channel output transistor N1, and a resistor RS coupled to the drains D1 and D2 of the output transistors P1 and N1. The output impedance of the output unit 12 is either the sum of the resistor RS and the transistor P1, or the sum of the resistor RS and the transistor N1, depending upon whether the driver logic's output is in the high state or the low state.

The number of the output units 12 used in conventional SST output drivers is typically pre-determined to obtain a desired output impedance. For example, if the output impedance of a single output unit 12 is 1,000 Ohms (for the RS plus P1, or the RS plus N1), then the combination of twenty output units 12 connected in parallel would yield an output impedance of 50 Ohms.

When driving the output transistors P1 and N1 in the output units 12, it is generally assumed that the available power supplies for the driving stage (drive logic) 14 are sufficient to fully turn ON and OFF the transistors N1 and P1. However, this is not the case for the latest generation of low power interfaces.

For example, the N channel transistor N1 is generally operating in a good range, since the driving logic 14 can swing between ground (GND), where N1 is turned OFF, and the VDD Core of the system, which, by definition, must be great enough to operate both P channel and N channel transistors (a positive voltage with respect to the reference voltage).

The P channel transistor P1, however, is not in such a fortunate position. The VDDIO voltage supplied to the source S1 of the transistor P1 in the output unit 12 is being lowered in contemporary design in order to save power consumption of the data transmitter, to the point that VDDIO is too small to provide a sufficient threshold voltage and overdrive for the transistor P1. The VDD Core voltage is greater than the VDDIO voltage. The drive signal to the gate G1 of P1 cannot drop below GND reference voltage, so that the transistor P1 cannot be adequately turned ON.

The existing solution for the inability to fully switch the P channel transistor P1 in the output unit of the conventional SST output driver takes the approach of making the high side switch (which was the P channel transistor P1) a "transmission gate" by placing an N channel transistor N2 in parallel with the P channel transistor P1, as depicted in FIG. 2A. In this design, the output stage 10' will typically, likewise, include a number of output units 12' connected in parallel. As distinguished from the output units 12, shown in FIG. 1, the output unit 12' includes an N channel transistor N2 coupled in parallel with the P channel transistor P1. In addition, an inverter INV1 is connected between the gate G1 of the P channel transistor P1 and the gate G2 of the N channel transistor N2, so that the gate G2 of the transistor N2 is driven with an opposite phased signal to that applied to the gate G1 of the P channel transistor P1, provided by the inverter INV1. When the VDDIO is too low to drive the P channel transistor P1 to turn ON by a signal at the GND voltage level, the N channel transistor N2 can be turned ON by a suitably high drive voltage from the VDD Core supply which powers the inverter INV1.

FIG. 2B graphically illustrates the relationship between the supply voltages of the output stage 10' and the range of minimum gate to source voltage VGS for each of the P and N channel transistors P1 and N2. As shown, VDD Core is a higher voltage (more positive) than VDDIO. In order to provide switch at voltage levels that are close to the threshold, P1 and N2 must be very large chips and therefore disadvantageously consume a great deal of valuable chip area.

This conventional approach to overcome the inability of the conventional SST output drivers to adequately turn ON the P channel transistor P1 works as long as the VDD Core is high enough relative to the VDDIO to fully turn ON the N channel transistor N2.

However, in modern data transmission systems, the core supply is often also low, and there may exist a region where neither the P channel transistor P1 nor the N channel transistor N2 can be adequately turned ON.

It therefore would be highly desirable to provide a more effective solution for Source-Series Terminated (SST) output drivers which would be able to adequately turn ON either a P channel transistor or an N channel transistor, even when the core supply is low.

SUMMARY OF THE INVENTION

A serial data link output driver is provided having serial data input and serial data output terminals and an output drive circuit having at least one pair of P and N channel output transistors. Each of the P and N channel output transistors have drain terminals commonly coupled to an output terminal of the serial data link. The serial data link output driver includes an input logic circuit that has at least one input terminal coupled to the serial data link output driver input terminal for receiving serial data signal therefrom. Further, the serial data link output driver includes at least one reset circuit having an input coupled an output of the input logic circuit and an output coupled to a gate terminal of at least one of the P and N channel output transistors of one pair of P and N channel output transistors. The at least one reset circuit is configured to output a voltage and polarity thereof sufficient to hold the at least one of the P and N channel output transistors of the one pair of P and N channel output transistors in an OFF state in correspondence with a logic level of the serial data input, and inhibited from output of a voltage in correspondence with an opposing logic level of the serial data input. Still further, the serial data link output driver includes a capacitor pump circuit having an input coupled to another output of the input logic circuit and an output coupled to the gate terminal of the at least one of the P and N channel output transistors of the one pair of P and N channel output transistors. The capacitor pump circuit is configured to capacitively store the voltage output by the at least one reset circuit relative to a logic level voltage of the other output of the input logic circuit. In correspondence with the inhibited output of the at least one reset circuit, the logic level voltage of the other output of the input logic circuit changes to an opposing logic level to thereby change the reference of the stored voltage and thereby establish a gate voltage of the at least one of the P and N channel output transistors of the one pair of P and N channel output transistors that exceeds a gate threshold turn-on voltage thereof.

From another aspect, a method of driving an output stage of a serial data link output driver is disclosed, where the output stage of a serial data link output driver has at least one pair of P and N channel output transistors, each having drain terminals commonly coupled to an output terminal of the serial data link. The method includes providing a capacitor pump circuit configured for establishing a logic level voltage on a first terminal of at least one capacitor corresponding to an opposing logic level to that of an input data bit. A second terminal of the at least one capacitor is coupled to a gate terminal of one of the P and N channel output transistors. The capacitor pump circuit is further configured for establishing a voltage and polarity on the second terminal of the at least one capacitor relative to the first terminal sufficient to hold the P or N channel output transistor having the gate terminal thereof coupled thereto in an OFF state. Responsive to another input data bit having an opposing logic level, the logic level on the first terminal of the at least one capacitor changes and thereby changes a magnitude of a voltage of the second terminal of the at least one capacitor relative to the first terminal thereof to a second voltage. The second voltage exceeds a gate threshold turn-on voltage of the P or N channel output transistor having the gate terminal thereof coupled to the second terminal of the at least one capacitor.

DETAILED DESCRIPTION OF THE PREFERRED EMBODIMENT(S)

Figure 1:
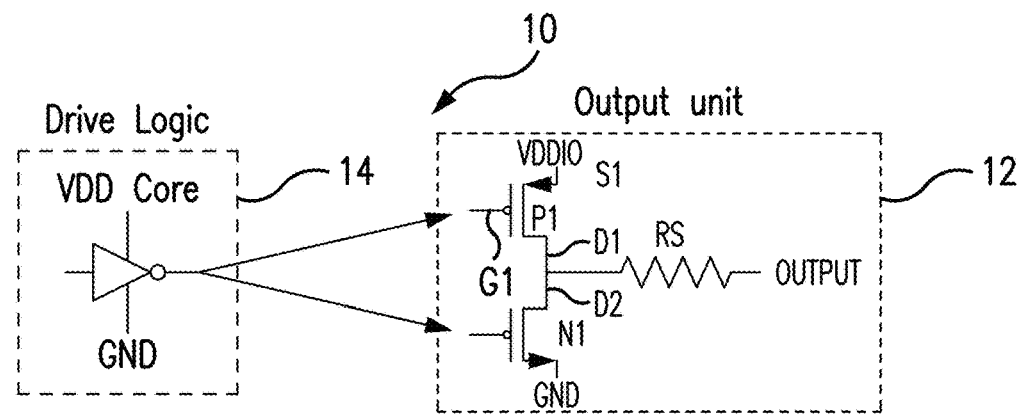
FIG. 1 is a schematic representation of a prior art SST output driver.
Figure 2A:
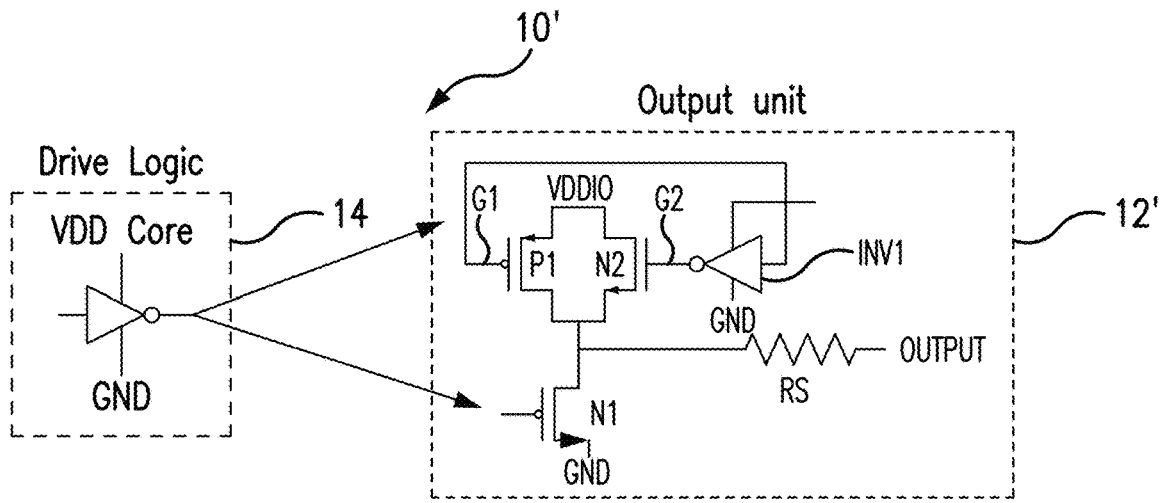
FIG. 2A is a schematic representation of a prior art SST output driver using a transmission gate as a high side switch.
Figure 2B:
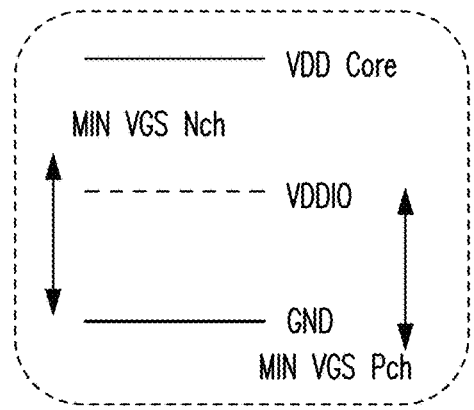
FIG. 2B is a graphical representation of the operating voltages for the N and P channel transistors of the prior art output driver of FIG. 2A.
Figure 3:
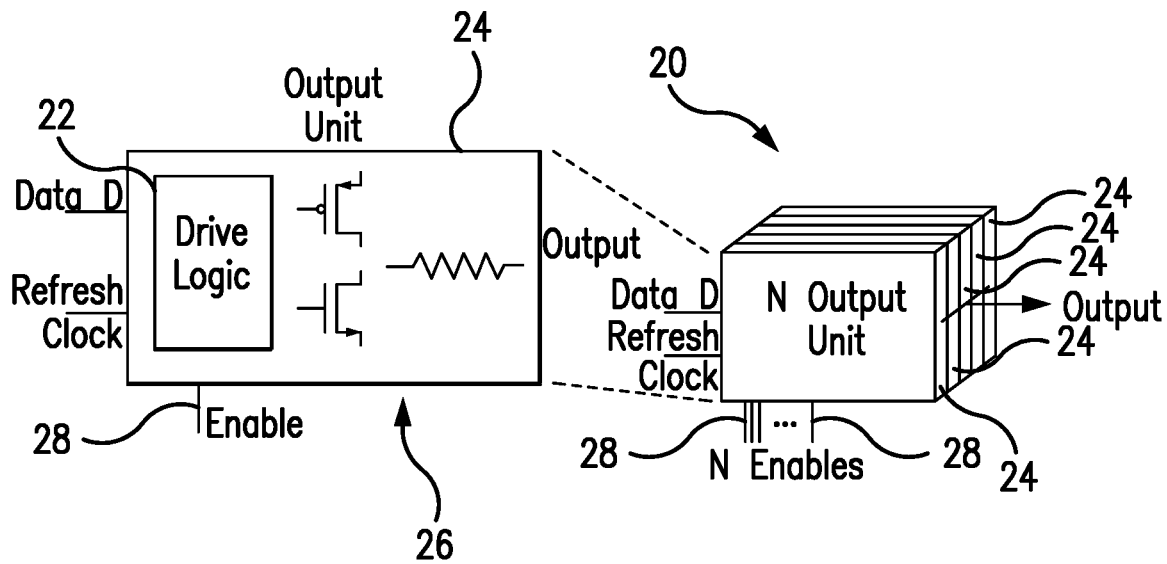
FIG. 3 is a schematic representation of a conventional transmitter of a data link with the drive logic unit attributed individually to each output unit.
Figure 4:
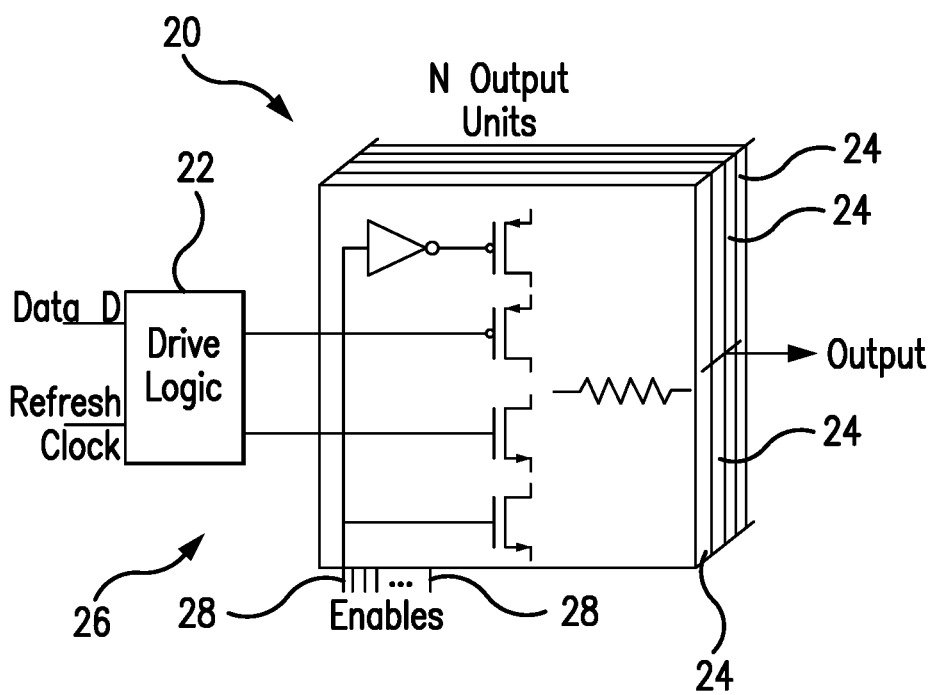
FIG. 4 is a schematic representation of a conventional transmitter of a data link with the drive logic common to all output units.

Referring to FIGS. 3 and 4, two different configurations of a conventional transmitter of a data link are shown. The data transmitter includes an output stage 20 which is configured with a drive logic sub-system (also referred to herein as a drive logic block) 22 and one or more output units 24. The drive logic sub-system 22 and one or more output units 24 constitute an output driver 26 of the output stage 20 of the data transmitter of a digital data communication link, preferably based on the CMOS digital technology. The drive logic sub-system 22 may be incorporated in each output unit 24 or be common to all of the output units 24, or portions thereof, in the output driver 26.

For example, referring to FIG. 3, for digital source impedance control, a separate drive logic sub-system 22 is incorporated in each respective output unit 24. In this implementation, the outputs of the N output units 24 are connected in parallel. An enable operation is performed through N enable paths 28, and each output unit 24 is individually controlled by a respective drive logic sub-system 22 to obtain a combined drive current required. The output units 24 are driven with individual data signals D and the refresh clock signals which may differ between the output units 24 or may be similar to one another.

If the drive logic block 22 is incorporated in each output unit 24, as shown in FIG. 3, the enable and disable operations for each output unit 24 can be performed in a simplified logic format. This approach is typically more power demanding than the approach in which the drive logic is common to all or large groups of output units.

Referring to FIG. 4, another conventional configuration of a transmitter of a data link is shown. In this configuration, a common drive logic sub-system (block) 22 is used in combination with N number of output units 24 (N being an integer greater than one). In this implementation, the output driver 26 is configured with a single drive logic sub-system 22 that drives the N output units 24. Each output unit 24 has an individual enable mechanism embedded in each output unit 24. Data signal D and the refresh clock signals are identical for all output units 24, since there is only one drive logic block 22 for all N output units 24.

If the drive logic 22 is designed to be common to all output units 24, as shown in FIG. 4, then the enable and disable operation must be performed in a final output stage of the output driver, which has an impact on signal integrity and power because the high side switches may require output transistors.

Although the subject digital source impedance control is contemplated in either of the implementations of FIGS. 3 and 4, for the sake of simplicity of description and as an example only, the exemplary systems described herein will be presented as a single drive logic block controlling a single output unit. However, it should be understood that the inventive concepts embodied in the exemplary systems described herein are likewise applicable to implementations where a common drive logic sub-system is used in conjunction with a plurality of output units.

Figure 5:
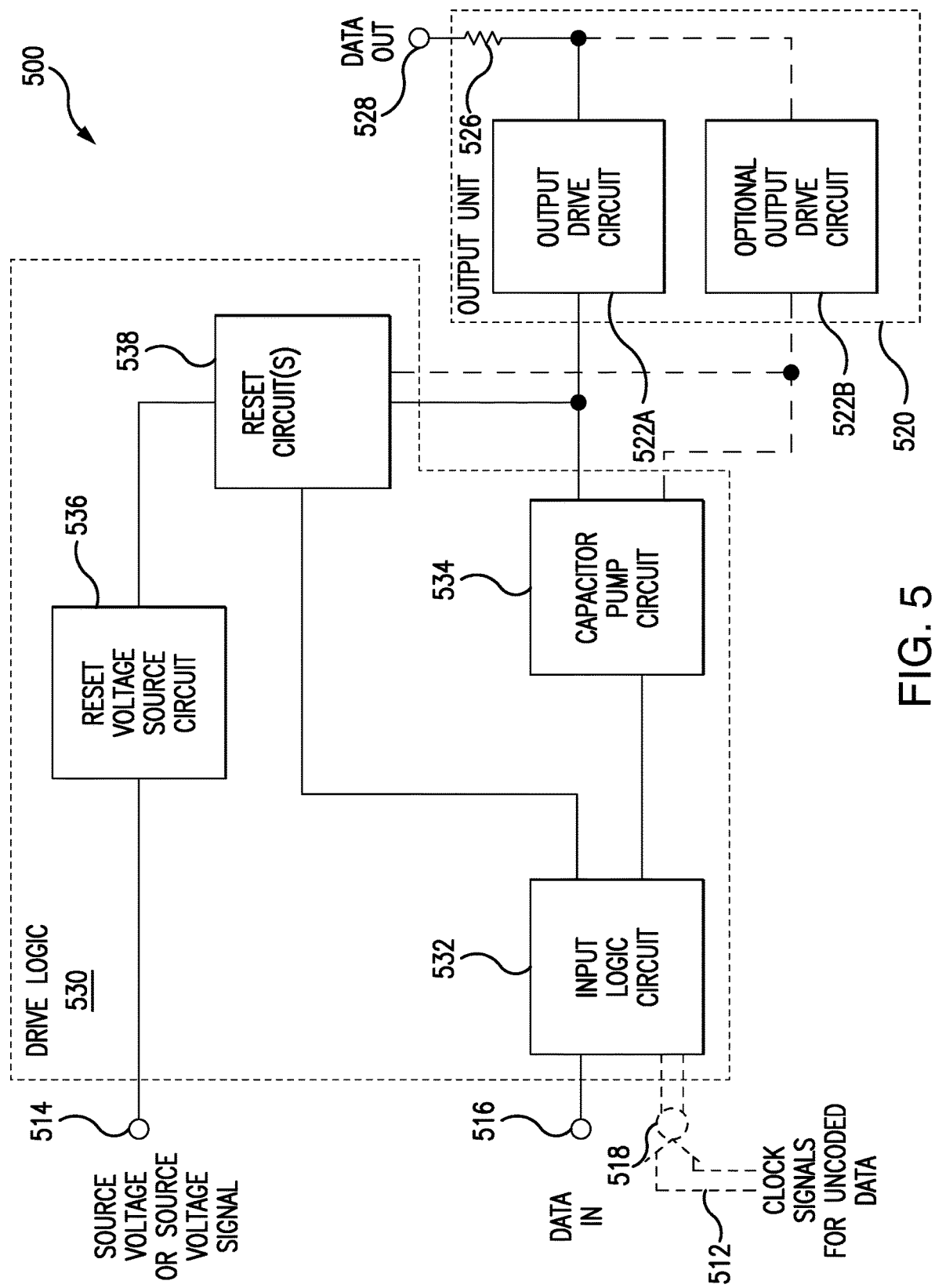
FIG. 5 is a block diagram of the subject system.

FIG. 5 is a block diagram for a transmitter 500 of a data link exhibiting a number of novel features. The transmitter 500 includes an output unit 520 and a drive logic block 530. The drive logic block 530 includes an input logic circuit 532 having an input 516 for providing the input data in the required state, inverted or noninverted, to other of the functional blocks of the drive logic block 530 portion of transmitter 500. Optionally, in addition to the data input 516, some implementations of the transmitter 500 may include an input logic circuit 532 with one or more clock signals 512 connected to one or more clock signal inputs 518 to control the distribution of the input data, as will be explained in following paragraphs.

The input logic circuit 532 provides a logic output responsive to the input data to the capacitor pump circuit 534, which in turn drives at least one output drive circuit 522a. Optionally, in some implementations of the transmitter 500, the output unit 520 may include a pair of output drive circuits 522a and 522b that alternately drive the logic output of output unit 520 of transmitter 500. The input logic circuit 532 also provides a logic output responsive to the input data to the reset circuit(s) 538, which in turn provide pull up voltage to the output drive circuits 522a and 522b and resets the capacitor pump circuit 534.

Reset circuit(s) 538 include one or more reset circuits for providing pull up voltage for one or both of a series connected P channel transistor and N channel transistor of the output drive circuit 522a (522b). The reset (pull up) voltage is supplied to the reset circuit from the reset voltage source circuit, which may be just a connection to a voltage source input to the input 514 or include a digital to analog converter (DAC) that provides a reset voltage responsive to a digital input signal supplied to input 514. Such digital input may be output from a processor (not shown) for setting the reset voltage to provide static compensation, as in compensating for such variables as manufacturing tolerances, and/or to provide dynamic compensation, as in compensating for such variables as environmental conditions.

Output unit 520 includes at least one output drive circuit 522a and an output resistor 526. As will be described herein, the implementations of output drive circuit 522a may include an N channel transistor and a P channel transistor coupled in series. Where the output unit 520 is implemented to include both the output drive circuit 522a and an output drive circuit 522b, the output drive circuit 522b may be implemented with a single transistor or another series coupled N and P channel transistor pair, as will be seen in exemplary transmitter circuits described herein.

Figure 6A:
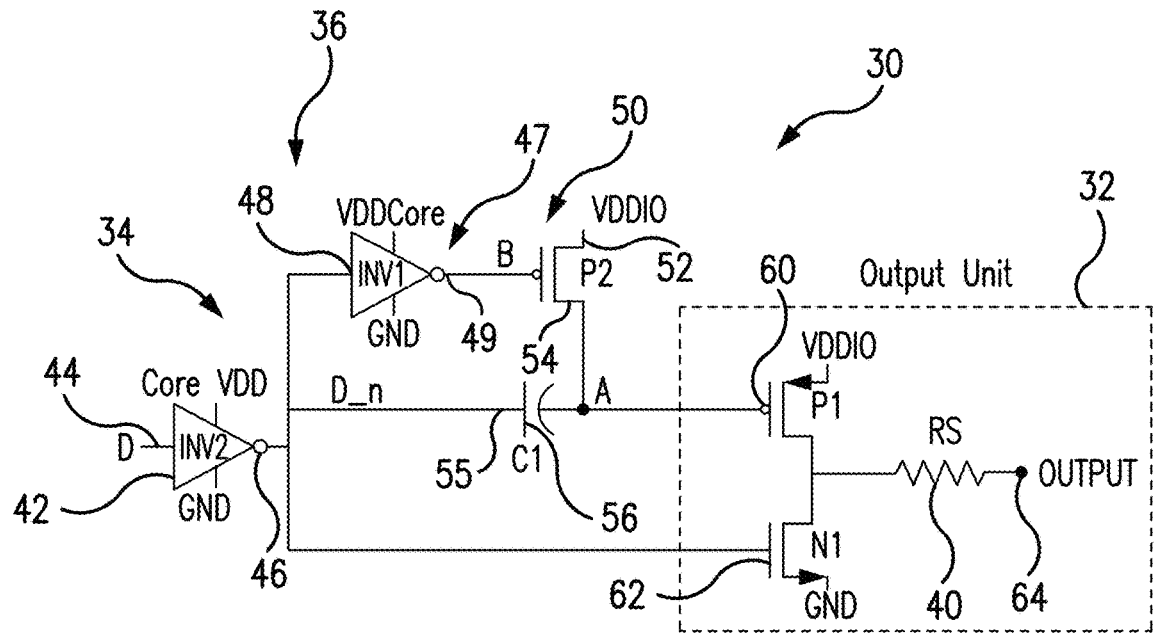
FIG. 6A is a schematic diagram of one configuration of the output driver of the present invention.

Referring now to FIG. 6A, the SST output driver 30 represents a simple circuit configuration of the transmitter 500, discussed above, and includes an output unit 32, a drive logic block 34, and an impedance control block (also referred to herein as a pump or a voltage pull-up stage) 36 incorporated in the drive logic block 34.

The output unit 32 of the SST output driver 30 includes a pull-up and pull-down branch implemented, respectively, with a P-channel metal-oxide semiconductor (PMOS) output transistor P1 and an N-channel metal-oxide semiconductor (NMOS) output transistor N1 followed by a resistor 40, which may be implemented with a polysilicon resistor.

The drive logic block 34 includes at least one logic device providing a NOT function that receives an input data signal that receives an input data signal D, which in the following exemplary embodiment is the input inverter (INV2) 42. Input inverter 42 has an input 44 for receiving the data signal D and an output 46 for outputting the inverted data signal D_n. The inverter 42 may be a CMOS inverter implemented with two transistors, such as PMOS and NMOS where the input data signal D is supplied commonly to the gates of both transistors PMOS and NMOS, as is well known in the art and therefore not shown in the drawings. The core voltage VDD Core (single power supply) is connected to a source of the PMOS transistor of the inverter. Hereto, VDD Core is a higher voltage than VDDIO. For example, in one embodiment, VDD Core is 0.8 volts while VDDIO is 0.4 volts. The ground (GND) reference voltage is connected to the source of the inverter NMOS transistor. The drain of the PMOS and NMOS transistors, respectively, are connected one to another and constitute the output 46 of the inverter 42.

The drive logic sub-system (block) 34 further includes another inverter (INV1) 47 which may be configured similar to the input inverter 42. The inverter 47 has an input 48 and an output 49. The input 48 of the inverter 47 is coupled to the output 46 of the inverter 42 for receiving the inverted data signal D_n output therefrom. The output 49 of the inverter 47 is connected to the node B which constitutes the gate of a PMOS transistor (P2) 50, which has its source 52 supplied with the voltage VDDIO and its drain 54 connected to the node A.

A capacitor (C1) 56 is coupled between the node A (the drain 54 of the PMOS transistor 50), and the output 46 of the input inverter 42. One terminal of the capacitor 56 is connected to the node A, connecting capacitor 56 to drain 54 of transistor 50 and to the gate 60 of the PMOS output transistor P1. The output 46 of the inverter 42 is coupled to the gate 62 of the output NMOS transistor N1.

Figure 6B:
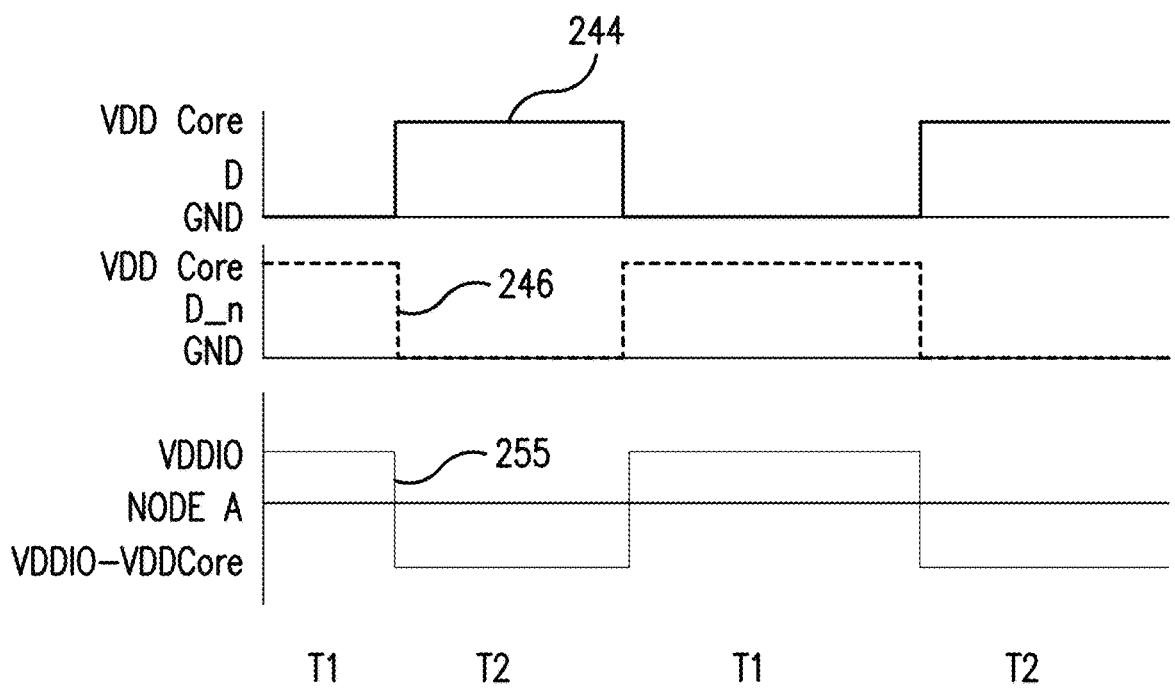
FIG. 6B is a timing diagram of signals at particular locations in the schematic diagram of FIG. 6A.

Referring now to FIGS. 6A and 6B, in time T1, the data signal D, represented by the graph line 244 in FIG. 6B, supplied to input 44 of the input inverter 42 is low (a logic 0), and the signal D_n, represented by the graph line 246 in FIG. 5B, at the output 46 of the input inverter 42 is high and thus, the VDD Core voltage is applied to the gate 62 of N channel output transistor N1. At time T1, the N channel output transistor N1 is turned ON, thereby connecting the output 64 to the ground reference through resistor 40. Accordingly, this action switches the output 64 of the output unit 32 to a logic low. The node B is at GND (low) and weakly turns ON the P channel transistor (P2) 50. This weak turn ON of the PMOS transistor (P2) 50 is sufficient, since the P channel transistor 50 is required only for refreshing the charge that leaks from the capacitor (C1) 56. The voltage at node A is raised to VDDIO by PMOS transistor 50 being switched ON, represented by the graph line 255 in FIG. 5B. The voltage on the other terminal 55 of the capacitor 56 is at the D_n voltage, which is at this time a logic high and therefor at VDD Core. Thus, the voltage across the capacitor 56 is the difference between VDD Core and VDDIO.

When the data signal D at the input 44 of the input inverter 42 goes high, to the VDD Core voltage, at time T2 in the example, the node B likewise switches to high and turns the PMOS transistor 50 OFF. The signal D_n, being the logical opposite of the data signal D, is low, which is the reference potential, and node A tracks the swing of that voltage, meaning the voltage at node A drops by the delta (difference) between VDD Core and GND. Thus, the node A is dropped to VDDIO minus VDD Core, relative to the reference potential at the capacitor terminal 55 and is therefore at a negative voltage relative to the reference potential, and is greater than the threshold voltage of the P channel output transistor (greater magnitude in a negative direction), providing a full swing of the drive voltage to the gate 60 of the PMOS output transistor P1 and thereby provides a full turn ON to the PMOS output transistor P1. With the P channel output transistor P1 turned ON, the output 64 is connected to the voltage VDDIO through resistor 40. Accordingly, this action switches the output 64 of the output unit 32 to a logic high.

By this arrangement, the output driver 30 thereby overcomes the deficiencies of the prior art, avoids the need for paralleled output transistors, and is implemented using far less chip area, on the order of ⅙ the chip area, obviating the need for large P and N channel transistors required by prior art driver circuits manufactured using "modern processes." Such processes include fin field-effect transistor (FinFET) processes and planar processes used for low power and low voltage applications. This basic operation presented in FIGS. 6A and 6B and described in the previous paragraphs is adequate for a fully functional output drive if the data is coded to not remain high for an excessive duration of time. That condition is true for many standards including, for example, the protocols which use 8b/10b or 64b/66b coding.

The 8b/10b or 64b/66b codes are transmission codes that are used to encode data before transmission. A transmitter maps each N-bit group to a greater-than-N-bit symbol, or line code, for transmission. A receiver at the other end of the communication channel will apply a reverse code map to the received signal to obtain the original N-bit group. The 8b/10b code maps each possible 8-bit word (256 cases) to a 10-bit word (1024 cases). The 64b/66b likewise maps all possible 64-bit data to selected 66-bit line codes.

Because the larger set of codes has extra "spare" codes, the extra codes are selected for useful characteristics, which may include near DC balance (equal 1's and 0's), a minimum number of transitions, etc. This also allows the coding to include extra control characters for "idle", "end of file", etc. More codes that allow for error detection and correction are possible, and the present system is applicable to different standards using other codes as well.

In another implementation of the transmitter 500, for communication standards that do not use coding, a capacitor refresh operation is added to the pump drive system, which will be described in the following paragraphs and depicted in FIGS. 7A and 7B. A common example of a standard that does not use coding is double data rate (DDR) signaling used in modern computing devices to communicate with dynamic random access memory (DRAM). The reason for not using any formal coding is usually concerned with latency, since it takes an extra cycle or more to encode and decode the signals in communications using a coding protocol. Also, there may be a bandwidth loss concern if N+M bits are transmitted to communicate just N bits of information. If the communication system does not have latency in speed of communication in a given channel, the coding of a signal means that less data can be transmitted.

Uncoded systems are to be synchronous either by a system having a common clock or by the clock being forwarded from the transmitting side to the receiving side of the communication channel. Most, if not all, codes provide enough information in the transmitter signal stream to recover the clock which facilitates asynchronous communications. When an output driver is needed for use in an application using a protocol that has no coding to prevent the system from receiving data with excessive durations of time of repeated high outputs, the configuration of the subject system using two pull-up stages, as described in the following paragraphs, will also advantageously replace prior art output drivers.

Figure 7A:
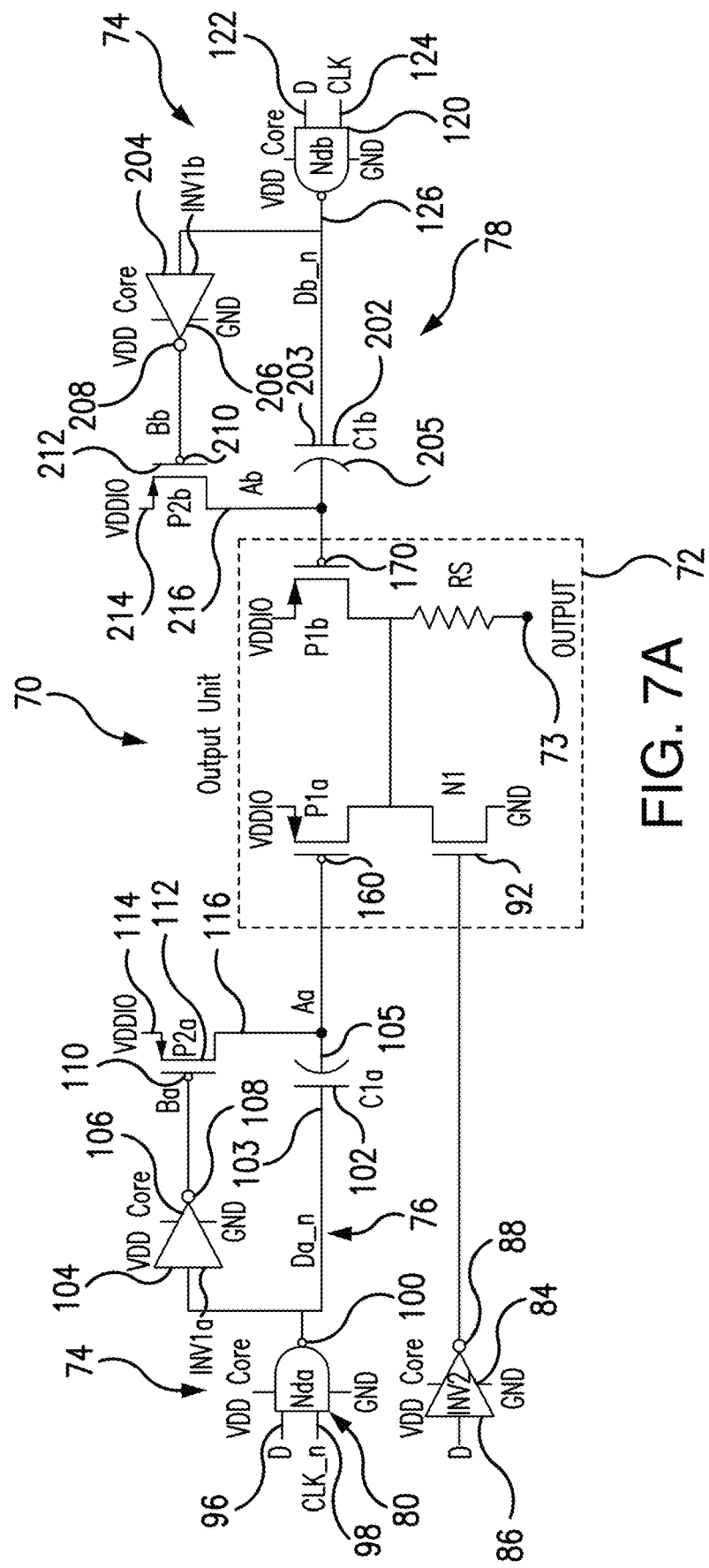
FIG. 7A is a schematic diagram of another configuration of the output driver of the present invention.

Referring now to FIG. 7A, the SST output driver 70 includes the output unit 72, a drive logic sub-system 74, and an impedance control block (also referred to herein as a pump or a voltage pull-up stage) which includes pull-up stages 76 and 78 coupled to the drive logic sub-system 74. In the following paragraph, labeling that incorporates a lower case "a" is used for the circuit elements of the pull-up stage 76 that correspond to the previously described pull-up stage 36 of FIG. 5A, whereas the labeling used for the circuit elements of the second pull-up stage 78 all include a lower case "b".

The output unit 72 of the SST output driver 70 includes a P channel output transistor P1a, an N channel output transistor N1, a P channel output transistor P1b having a source and drain respectively coupled in parallel with the source and drain of P channel output transistor P1a, and a resistor RS coupled to the drains of the output transistors P1a, P1b, and N1 on one end thereof and to the output 73 on the opposing end. The resistor RS may be implemented with a polysilicon resistor.

The drive logic sub-system 74 includes three logic devices providing a NOT function that receives an input data signal D. Two of the logic devices are represented by (a) an input inverter (INV2) 84 that receives, as an input, the input data signal D, and (b) a NAND gate 80 that receives, as an input, the input data signal D and a gating clock signal CLK_n. The third of the logic devices is the NAND gate 120 that receives, as an input, the input data signal D and a gating clock signal CLK.

The data signal D is received at the input 86 of the input inverter 84. The input inverter 84 operates to provide an inverted data signal D_n at the output 88 thereof. The inverted data signal D_n is coupled to the gate 92 of the N channel output transistor N1 of the output unit 72. Thus, when the data signal D is a logic low (a logic 0), the output 88 of input inverter 84 is a logic high (a logic 1), providing an output voltage of VDD Core to the gate 92 of N channel output transistor N1. The N channel output transistor N1 is thereby turned on, connecting the output 73 of the output unit 72 to the ground reference and thereby providing a logic low at the output 73.

A portion of the pull-up stage 76 is similar to the design and function of the pump (or pull-up) stage 36 shown in FIG. 5A in that the pull-up stage 76 includes an inverter 106 (INV1a) having an input 104 and output 108. The output 108 of the inverter 106 is connected to the node Ba which constitutes the gate 110 of a PMOS transistor (P2a) 112, which has its source 114 supplied with the voltage VDDIO and its drain 116 connected to the node Aa.

However, the pull-up stage 76 shown in FIG. 6A differs from the pull-up stage 36 of FIG. 6A in that it includes an input NAND gate 80, which provides a NOT function and in combination with input inverter 84 replacement of the input inverter 42 in the pull-up stage 36.

The NAND gate 80 is driven from the data signal D and is enabled by the clock signal CLK_n. The NAND gate 80 has a first input 96 for receiving the input data signal D, a second input 98 for receiving the CLK_n signal, and an output 100. A capacitor (C1a) 102 is coupled between the node Aa (the drain of the PMOS transistor 112) and the output 100 of the NAND gate 80.

Specifically, the output 100 of the NAND gate 80 outputs a signal D_n which is coupled to one terminal 103 of the capacitor (C1a) 102 and to the input 104 of the inverter (INV1a) 106. The output 108 of the inverter 106 is coupled to the gate 110 of the PMOS transistor (P2a) 112. The source 114 of the P channel transistor 112 is coupled to the VDDIO voltage source, while the drain 116 of the PMOS transistor 112 is coupled to the node Aa, to which the second terminal 105 of the capacitor 102 is connected, as is the gate 160 of the P channel output transistor P1a.

The NAND gate (Ndb) 120 of the drive logic sub-system 74 receives input the input data signal D at input 122 and clock signal CLK at input 124, and produces, at the output 126, a gated inverted data signal Db_n. The pull-up stage 78 includes (a) an inverter (INV1b) 206 having an input 204 and an output 208, (b) a PMOS transistor (P2b) 212 having a gate 210, a source 214, and a drain 216, and (c) a capacitor (C1b) 202 having terminals 203 and 205. The inverted data signal Db_n is supplied from the output 126 of the NAND gate 120 to the input 204 of the inverter 206 and to the terminal 203 of the capacitor 202. The output 208 of the inverter 206 is coupled to the gate 210 of the PMOS transistor 212. The source 214 of the PMOS transistor 212 is coupled to the supply voltage VDDIO, while the drain 216 of the PMOS transistor 212 is connected to the node Ab, joining the terminal 205 of the capacitor 202 to the gate 170 of the P channel output transistor P1b.

The pull-up stage 78 mirrors the pull-up stage 76, with the exception that the NAND gate (Ndb) 120 is driven by a clock signal CLK rather than CLK_n, as is the case with the NAND gate (Nda) 80 in the pull-up stage 76. The clock signals CLK and CLK_n are not simply inverted versions of one another and their relationship to one another will be described in the following paragraphs.

The N channel path including the input inverter 84 and the output NMOS transistor N1 receives, at the input 86, the input data signal D, and is not duplicated or gated by either of the clock signals CLK or CLK_n. When the clock signal CLK is high and the clock signal CLK_n signal is low, the "b" path (the pull-up stage 78) is enabled, and the "a" path (the pull-up stage 76) is in refresh mode of operation, where the P channel transistor (P2a) 112 is turned ON and Da_n signal is high. When the CLK_n signal is high, and the CLK signal is low, the "a" path is enabled (the pull-up stage 76), and the "b" path (the pull-up stage 78) is in the refresh mode of operation (the P channel transistor P2b is turned ON, and Db_n is high). The clock signals CLK and CLK_n are independent from the data signal, and the clock signals CLK and CLK_n may be slower than data transmission.

Figure 7B:
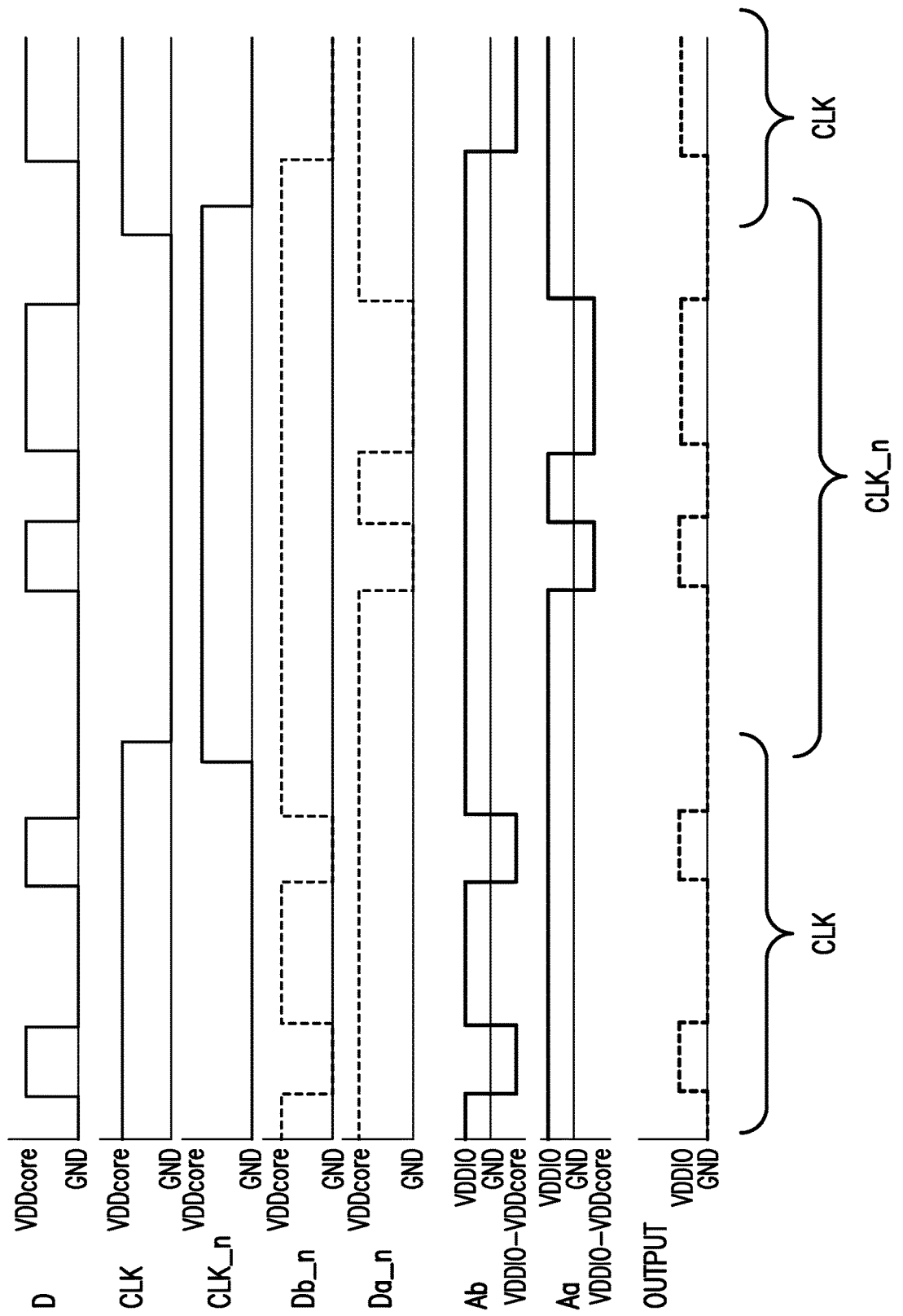
FIG. 7B is a timing diagram of signals at particular locations in the schematic diagram of FIG. 7A.

As shown in FIG. 7B, the clock signals CLK and CLK_n have overlapping high states, where at their respective signal transitions one of the clock signals is in a high state. The control provided by overlapped clock signals can be referred to as providing a "make before break" feature. This arrangement ensures that one of the two pull-up stages 76 or 78, is always active. Poor control of the "make before break" feature of the clock signals may cause glitches at the output of the drive logic. In order to avoid these glitches, the approach applying slight variations of the phase of the refresh clock signal for different output units is used herein to reduce the impact of the poor phasing of the clock signals.

Referring to both FIGS. 7A and 7B, the respective outputs of the NAND gates 80 and 120, Da_n and Db_n, are gated inverted data signals. When Da_n and Db_n are not gated ON, they are high. When the inverted data signals Da_n or Db_n are high (either by the data D being low and the corresponding clock signal being high to gate it, or when the corresponding clock signal is low), the associated capacitors 102 and 202 are in a "refresh" mode of operation with one side (terminal 103 and 203) of the respective capacitors 102 and 202 being at the VDD Core voltage and the other side (terminals 105 and 205) being at the VDDIO voltage by corresponding weakly turned ON P channel transistors 112 and 212. Accordingly, under those conditions, the capacitors 102 and 202 are charged to a voltage corresponding to the difference between VDD Core and VDDIO (VDD Core–VDDIO) at capacitor terminals 103 and 203 relative to capacitor terminals 105 and 205. When the gated inverted data signal Da_n or Db_n switches to low (because it is gated ON by the corresponding clock signals CLK_n and CLK at the respective pull-up stages 76 and 78, and the D input is high), the capacitor terminals 103 and 203 are brought to the reference potential of the logic low and a respective signal at the nodes Aaa and Ab is driven low by the difference voltage VDD Core–VDDIO and will be a negative voltage relative to the reference potential and is much greater than the threshold voltage of the respective P channel output transistor to thereby strongly turn ON the P channel output transistors P1a and P1b, respectively connecting the output 73 to the VDDIO voltage through the resistor RS and providing a logic high output.

Looking specifically at the pull-up stage 76 with the capacitor 102 charged to the difference voltage VDD Core–VDDIO, when the inverted data signal Da_n at the output 100 of the NAND gate 80 switches to low (because the input data signal D at the input 96 of NAND gate 80 is high and it is gated ON by the clock signal CLK_n at the input 98 of NAND gate 80 being high), the capacitor terminal 103 is pulled to the voltage of the logic low, which is the ground reference potential. As one side of the capacitor has swung from VDD Core to the reference potential, so must the other side of the capacitor swing equally in this circuit arrangement. Therefore, the voltage at capacitor terminal 105 will now be a voltage below the reference potential (a negative voltage) of a magnitude equal to VDD Core−VDDIO. This provides a voltage that is greater than the threshold voltage of the P channel output transistor to a strong drive to gate 160 of the P channel output transistor P1a in the output unit 72. The P channel output transistor P1a thereby turns ON and connects the VDDIO voltage, connected to the drain of the P channel output transistor P1a, to the output 73 of output unit 72, through resistor RS. Accordingly, this action switches the output 73 of the output unit 72 to a logic high.

With regard to the pull-up stage 78 with the capacitor 202 charged to the difference voltage VDD Core−VDDIO, when the inverted data signal Db_n switches to low (because the input data signal D at the input 122 of NAND gate 120 is high and it is gated ON by the clock signal CLK at the input 124 of NAND gate 120 being high), pulling the capacitor terminal 203 to the voltage of the logic low, which is the ground reference potential. As one side of the capacitor has swung from VDD Core to the reference potential, so must the other side of the capacitor swing equally in this circuit arrangement. Therefore, the voltage at capacitor terminal 205 will now be a voltage below the reference potential (a negative voltage) of a magnitude equal to VDD Core−VDDIO which is greater than the threshold voltage of the P channel output transistor. This provides a strong drive to the gate 170 of P channel output transistor P1b in the output unit 72 and connects the VDDIO voltage, connected to the drain of the P channel output transistor P1b, to the output 73 of output unit 72, through resistor RS. Accordingly, this action switches the output 73 of the output unit 72 to a logic high. Hence, in instances where the input data signal has a series of sequential highs (logic ones), the logic highs at the output 73 are alternatingly supplied by P channel output transistors P1a and P1b.

Through use of the capacitor pump drive, the P channel output transistors will always be sufficiently driven to an ON state, irrespective of how small the difference is between the "rail-to-rail" voltages that define logic signal levels. Further, even with the added two pull-up circuits 76 and 78, the output driver 70 is implemented using far less chip area compared to prior art driver circuits, as the need for the extremely the large P and N channel output transistors, common in the prior art, are eliminated.

The implementations of the capacitively coupled final drive stages shown in FIGS. 6A and 7A were directed to solving the problem of inadequate drive for the P channel transistor when the VDDIO supply is lower than the typical core supply (VDD Core) for that process. This technique can also be used to provide a continuous and low power method of controlling the precise drive to both the P channel and N channel output transistors.

Aside from overcoming the problem of inadequate drive for the P channel transistor, the reason to control the gate drive of both N and P channel output transistors is to control the output impedance of a drive unit. By controlling the gate drive of both N and P channel output transistors, the prior art method of controlling the output impedance, by adjusting the number of drive units used in parallel, can be replaced by using one large unit with the drive voltage to each of the N and P channel output transistors being controlled. By this method of impedance control, the ohmic value of the output resistor can be reduced, and thereby provide a savings in chip area, accompanied by a reduction in drive power resulting from reduced gate capacitance of the output transistors, which is illustrated in FIG. 8.

Figure 8:
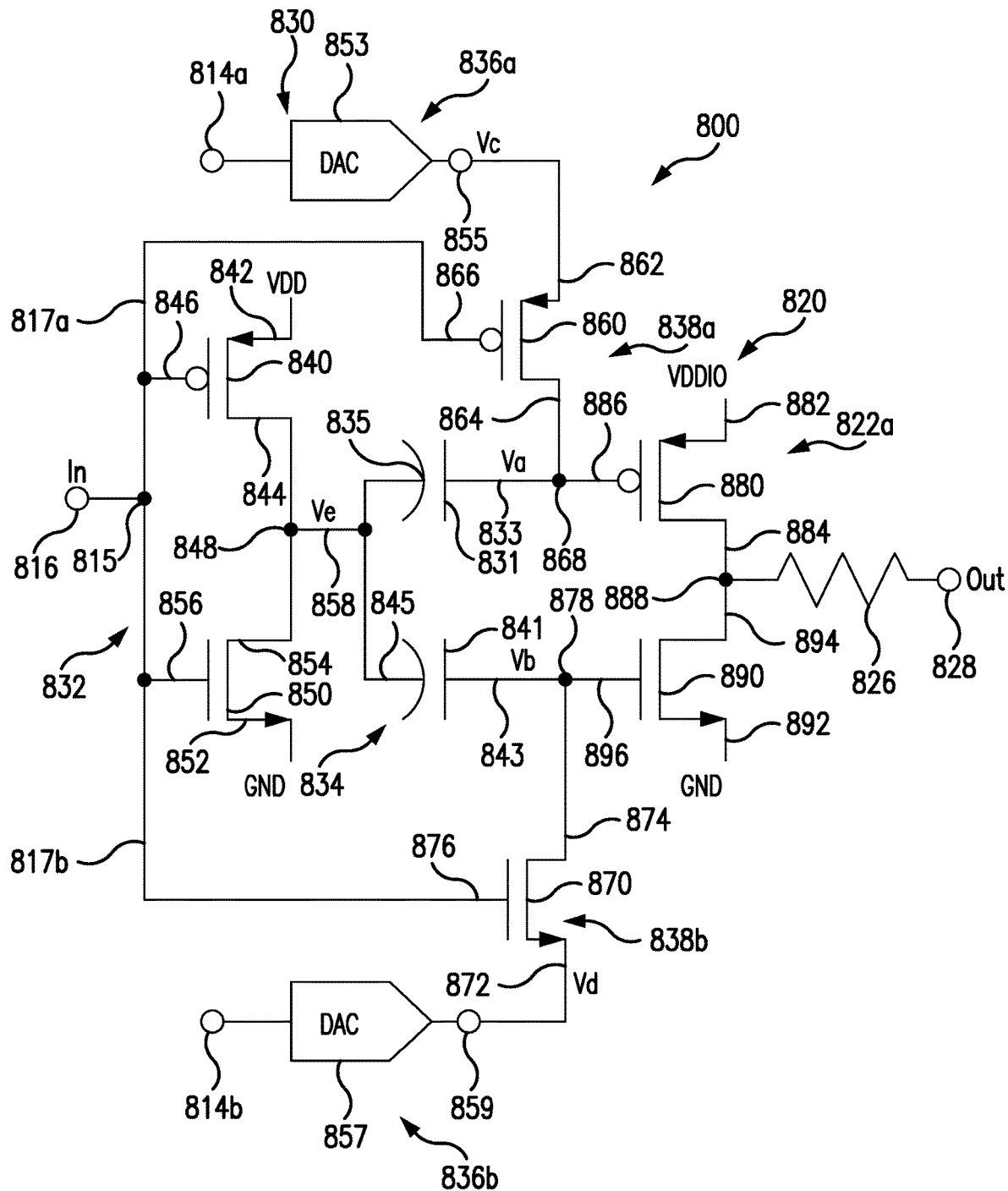
FIG. 8 is a schematic diagram of a configuration of the output driver of the present invention utilizing a capacitive pump for each of the N and P channel output transistors; and, FIG. 9 is a schematic diagram of a further configuration of the output driver of the present invention utilizing a capacitive pump for each N and P channel output transistor.

Turning now to FIG. 8, there is shown output driver 800 representing a circuit configuration of the transmitter 500 that both overcomes the problem of inadequate gate drive of the output P channel transistor and also provides control of the output impedance of the output unit 820 to overcome the effects of process variations and environmental changes. Output driver 800 includes the drive logic circuit 830, which is coupled to the output unit 820, and has an input 816 for receiving digital data signals that are then transmitted by a data line connected to the data output 828. The input 816 is coupled to the input 815 of input logic circuit 832, which, in addition to the conducting lines 817a and 817b, includes an inverter circuit formed by a P channel transistor 840 and an N channel transistor 850. The gates 846 and 856 of the respective P and N channel transistors are each coupled to the input 816 and the corresponding drains 844 and 854 of the two transistors 840 and 850 are joined together at the inverter output node 848. The source 842 of P channel transistor 840 is connected to the core voltage VDD and the source 852 of N channel transistor 850 is connected to the chip ground reference potential GND. The output of input logic circuit 832 provided at inverter output node 848 is designated as the voltage Ve and connected by the conducting line 858 to the capacitor pump circuit 834, which voltage will be either VDD or GND voltages.

In this exemplary circuit, input logic circuit 832 further includes the conducting lines 817a and 817b that respectively connect the input 815 of the logic circuit 832 to the reset circuits 838a and 838b. The reset circuits 838a and 838b are switches arranged between corresponding reset voltage source circuits 836a and 836b and the capacitor pump circuit 834, and the capacitor pump circuit 834 is correspondingly drivingly coupled to the output drive circuit 822a of the output unit 820. The capacitor pump circuit 834 is formed by two capacitors 831 and 841, each having a first terminal 835 and 845 coupled in common with the conducting line 858 and a second terminal 833 and 843 that are in turn connected to output transistors 880 and 890 of the output drive circuit 822a.

The second terminal 833 of capacitor 831 is also coupled to the output of the reset circuit 838a at a node 868. Similarly, the second terminal 843 of capacitor 841 is further coupled to the output of the reset circuit 838b at a node 878. The reset circuit 838a is formed by the P channel transistor 860 having a source 862 coupled to the output 855 of the reset voltage source circuit 836a, a gate 866 coupled to the conducting line 817a of the input logic circuit 832, and a drain 864 connected to the second terminal 833 of capacitor 831, at node 868. Correspondingly, the reset circuit 838b is formed by the N channel transistor 870 having a source 872 coupled to the output 859 of the reset voltage source circuit 836b, a gate 876 coupled to the conducting line 817b of the input logic circuit 832, and a drain 874 connected to the second terminal 843 of capacitor 841, at node 878.

While each of the reset voltage source circuits may be formed by fixed supply voltage, such as VDDIO, as in the previously described exemplary circuits, it is believed to be advantageous to charge the capacitor pump circuit using a digitally controlled variable supply voltage (reset charging voltage). The digitally controlled variable supply voltage of the reset voltage source circuits 836a and 836b are provided via digital to analog converters (DACs) 853 and 857 having inputs 814a and 814b that receive a digital input from a processor (not shown) corresponding to a particular voltage. The initial digital input may represent a nominal standard operating voltage, or one adjusted up or down, based on pretesting of the "chip" employing output driver 800, to thereby compensate for operating difference that can occur as a result of chip manufacturing process variations. Further, the processor may monitor ambient conditions of the chip and dynamically adjust the digital representation of the reset charging voltage to compensate for changes due to the detected ambient condition changes.

As mentioned, the output unit 820, in this exemplary circuit, includes a single output drive circuit 822a which has an output node 888, which node is coupled to the data output 828 through a series coupled resistor 826. Output drive circuit 822a includes a P channel transistor 880 having a gate 886 coupled to the second terminal 833 of the pump capacitor 831 at the node 868. Transistor 880 has its source 882 coupled to the VDDIO supply voltage, and its drain 884 coupled to the output node 888. Output drive circuit 822a further includes an N channel transistor 890 having a gate 896 coupled to the second terminal 843 of the pump capacitor 841 at the node 878. Transistor 890 has its source 892 coupled to the chip ground reference potential GND, and its drain 894 coupled to the output node 888.

Now we will look at the operation of the circuit and initially consider the outputs of the DACs 853 and 857 to respectively be equivalent to the supply voltages of the prior described exemplary circuits, with the output voltage Vc of DAC 853 at the output 855 being the VDDIO voltage, and the output voltage Vd of DAC 857 at the output 859 being the reference voltage (GND). As the input logic circuit 832 is an inverter, we can see that with respect to the driving circuit for the P channel output transistor 880, including the capacitor 831 and the reset P channel transistor 860, such circuit is identical to the pump capacitor drive circuit of FIG. 6A (note that the two inverters 42 and 48 logically negate each other) and likewise operates in accordance with the signal diagram of FIG. 6B, and therefore the description of its operation (logic 1 input) will not be repeated here.

If a logic 0, a Low (L), is received at the input 816, such is applied to the gates 846, 856, 866, and 876, to thereby turn ON the P channel transistors 840 and 860, and turn OFF the N channel transistors 850 and 870. Thus, the voltage Ve goes high to VDD and, since Vb is not held low by reset transistor 870, Vb will rise to equal Ve, which is now VDD, and will be applied to the gate 896 of the N channel output transistor 870, to now turn it ON and bring the output node 888 and circuit's data output 828 to a Low. As can be gleaned from the forgoing circuit descriptions, the reset transistors, such as transistors 860 and 870, have very low current handling demands and therefore advantageously have the smallest chip area requirements of any of the active devices of the output driver.

Now we will consider the situation wherein a processor controls the DAC 857 to output a voltage other than the GND reference voltage. Due to ambient thermal conditions or a process variation discovered in the manufacture's chip testing phase of production, the output of the DAC 857 might be set to −0.2 volts, rather than GND. Looking at the reset voltage source circuit 836b, when a logic 1 (H) was applied to the input 816, Ve was at 0 volts and as Vd was at −0.2 volts, then Vb will be at −0.2 volts, as well. Now, when the input 816 goes low, we saw the Ve goes to VDD, because transistor 840 turned ON, and since reset transistor 870 turns OFF, the change in voltage on the left side of capacitor 841, the voltage Ve, must be reflected in a change in voltage on the right side. Since Ve is equal to VDD, then Vb must now be equal to the voltage—0.2+VDD volts, in this example. Thus, it can be seen that the amount of overdrive (a voltage beyond the turn ON gate voltage threshold) that is applied to the N channel output transistor 890 can be adjusted by altering the output voltage of DAC 857, and in fact, the same is true for DAC 853 driving the P channel transistor.

As seen, the voltage Va will swing from a high voltage of Vc to a low voltage of Vc−VDD. Likewise, the voltage Vb will swing from a low voltage of Vd to a high voltage of Vd+VDD. Voltages Vc and Vd are supplied by the DACs 853 and 857. The required current from the DACs is only leakage of the devices connected to the output, so simple low power DACs are sufficient for the output driver's operation.

Figure 9:
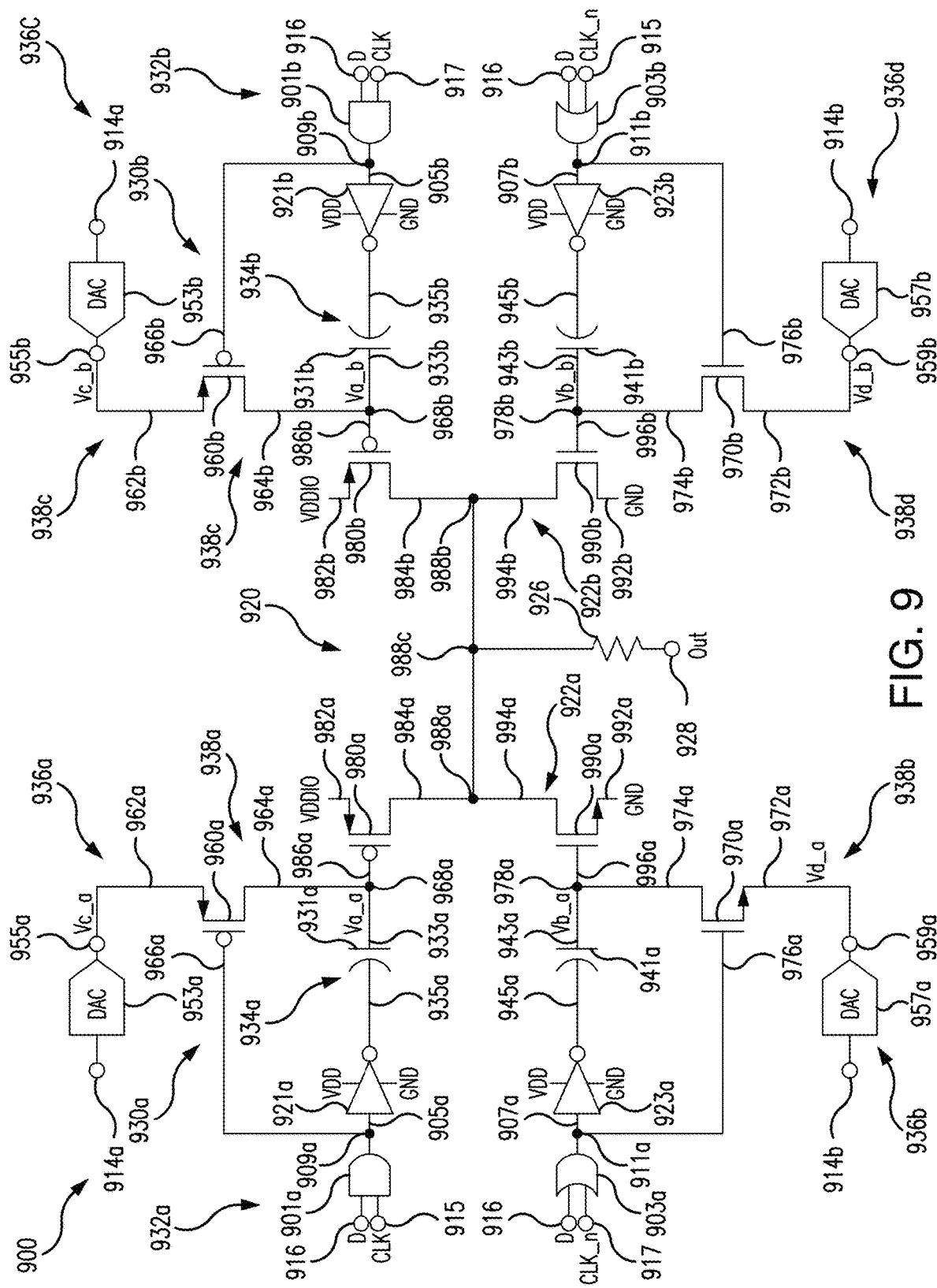

Turning now to FIG. 9, there is shown output driver 900 having a CLK active portion (left side relative to the node 988c) and a CLK_n active portion (right side relative to the node 988c), as was similarly done in the output driver of FIG. 7A. The CLK and CLK_n and data exemplary signal waveforms shown in FIG. 7B apply to output driver 900, as well. Other than the input logic circuitry 932a and 932b, the remaining portions of the drive logic circuits 930a and 930b each correspond to the drive logic circuit 830 shown in FIG. 8, as the output drive circuits 922a and 922b correspond with the output drive circuit 822, shown in FIG. 8.

In this exemplary circuit, input logic circuit 932a includes an AND gate 901a having a first input that connects to the data input 916 and an output 905a coupled to a node 909a, to which the reset circuit 938a connects. The AND gate 901a has a second input connected to the CLK signal input 915. The input logic circuit 932a further includes an OR gate 903a having a first input connected to the data input 916 and a second input connected to the CLK_n signal input 917. The output of OR gate 903a is connected to a node 911a, to which the reset circuit 938b connects. For simplicity of the drawing, connections to a common terminal, while shown in separate locations, are designated with a common reference number to indicate they are the same terminal. Terminals shown in this manner are the data input 916, the CLK input 915, the CLK_N input 917, and the DAC inputs 914a and 914b. The input logic circuit 932a additionally includes a first inverter circuit 921a having an input connected to the node 909a and an output connected to the capacitor pump circuit 934a, and a second inverter circuit 923a having an input connected to the node 911a and an output connected to the capacitor pump circuit 934a. The DAC inputs 914a and 914b connect to outputs of a processor (not shown) that may be located "on or off chip" and controls the output voltages of the DAC. While the respective DACs of the corresponding reset voltage source circuits 936a, 936c, 936b and 936d, are shown with respective inputs in common, they may each be separately controlled if necessary to properly compensate for manufacturing/ambient variations between the drive logic circuits 936a and 936b.

The reset circuits 938a and 938b are transistor switches respectively arranged between corresponding reset voltage source circuits 936a and 936b and the capacitor pump circuit 934a. The capacitor pump circuit 934a is correspondingly drivingly coupled to the output drive circuit 922a of the output unit 920. The capacitor pump circuit 934a is formed by two capacitors 931a and 941a, each having a first terminal 935a and 945a respectively coupled to the output of the first inverter circuit 921a and the output of the second inverter circuit 923a. Each capacitor has a second terminal 933a and 943a that are respectively connected to output transistors 980a and 990a of the output drive circuit 922a.

Specifically, the output of first inverter circuit 921a is connected to the first terminal 935a of capacitor 931a and the second terminal 933a of capacitor 931a is connected to a node 968a to which the gate 986a of the P channel output transistor 980a is likewise connected. The reset transistor 960a has a gate 966a connected to the node 909a of the input logic circuit 932a, a drain 964a connected to the node 968a and a source 962a connected to the output terminal 955a of a DAC 953a of the reset voltage source circuit 936a. Likewise, the output of second inverter circuit 923a is connected to the first terminal 945a of capacitor 941a and the second terminal 943a of capacitor 941a is connected to a node 978a to which the gate 996a of the N channel output transistor 990a is also connected. The reset transistor 970a has a gate 976a connected to the node 911a of the input logic circuit 932a, a drain 974a connected to the node 978a and a source 972a connected to the output terminal 959a of a DAC 957a of the reset voltage source circuit 936b. The DAC 957a has an input 914b that connects to a processor output (not shown) that establishes the analog voltage output by the DAC and can thereby provide a static output voltage selected to compensate for manufacturing tolerance variations detected during initial chip testing, or dynamically vary the DAC output to compensate for changes in ambient conditions, and may still also provide compensation for manufacturing tolerance variations. Thus, the output voltage Vd_a may be the ground reference voltage or a negative voltage that when applied to the gate 996a of the N channel output transistor 990a, maintains the transistor in an OFF state.

The output unit 920 includes an output drive circuit 922a that includes the P channel output transistor 980a having a drain 984a coupled to a node 988a, and the N channel output transistor 990a. The N channel output transistor 990a likewise has a drain 994a connected to the node 988a, and to which an output node 988c of output unit 920 is connected. The output impedance matching resistor 926 of output unit 920 is coupled between the output node 988c and an output terminal 928. The gate 986a of P channel output transistor 980a is connected to the node 968a, and the gate 996a of N channel output transistor 990a is connected to the node 978a. The P channel output transistor 980a has a source 982a that is connected to the VDDIO voltage, and the N channel output transistor 990a has a source 992a that is connected to the ground reference voltage GND.

The output driver 900, like the output driver 70 of FIG. 7A, is designed for use with uncoded data, which may receive strings of ones or zeros, which then might not allow for sufficient recharging of the capacitor pump circuit. To obviate that potential problem, output driver 900 includes the drive logic circuit 930a, just described, and a second drive logic circuit 930b, and each of the drive logic circuits 930a and 930b operate alternately to drivingly output the data that is input to the output driver 900 in respective correspondence with the CLK and CLK_N clock signals.

Input logic circuit 932b, of the drive logic circuit 930b, includes an AND gate 901b having a first input that connects to the data input 916 and an output 905b coupled to a node 909b, to which the reset circuit 938c connects. The AND gate 901b has a second input connected to the CLK_n signal input 917. The input logic circuit 932b further includes an OR gate 903b having a first input connected to the data input 916 and a second input connected to the CLK signal input 915. The output of OR gate 903b is connected to a node 911b, to which the reset circuit 938d connects. The input logic circuit 932b additionally includes a first inverter circuit 921b having an input connected to the node 909b and an output connected to the capacitor pump circuit 934b, and a second inverter circuit 923b having an input connected to the node 911b and an output connected to the capacitor pump circuit 934b.

The reset circuits 938c and 938d are transistor switches respectively arranged between corresponding reset voltage source circuits 936c and 936d and the capacitor pump circuit 934b. The capacitor pump circuit 934b is correspondingly drivingly coupled to the output drive circuit 922b of the output unit 920. The capacitor pump circuit 934b is formed by two capacitors 931b and 941b, each having a first terminal 935b and 945b respectively coupled to the output of the first inverter circuit 921b and the output of the second inverter circuit 923b. Each capacitor has a second terminal 933b and 943b that are respectively connected to output transistors 980b and 990b of the output drive circuit 922b.

The output of first inverter circuit 921b is connected to the first terminal 935b of capacitor 931b and the second terminal 933b of capacitor 931b is connected to a node 968b to which the gate 986b of the P channel output transistor 980b is likewise connected. The reset transistor 960b has a gate 966b connected to the node 909b of the input logic circuit 932b, a drain 964b connected to the node 968b and a source 962b connected to the output terminal 955b of a DAC 953b of the reset voltage source circuit 936b. In a like manner, the output of second inverter circuit 923b is connected to the first terminal 945b of capacitor 941b and the second terminal 943b of capacitor 941b is connected to a node 978b to which the gate 996b of the N channel output transistor 990b is also connected. The reset transistor 970b has a gate 976b connected to the node 911b of the input logic circuit 932b, a drain 974b connected to the node 978b and a source 972b connected to the output terminal 959b of a DAC 957b of the reset voltage source circuit 936d.

The output unit 920 also includes an output drive circuit 922b, which includes the P channel output transistor 980b having a drain 984b coupled to a node 988b, and the N channel output transistor 990b having a drain 994b also connected to the node 988b, to which an output node 988c of output unit 920 is connected. As previously described, the output resistor 926 of output unit 920 is coupled between the output node 988c and an output terminal 928. The gate 986b of P channel output transistor 980b is connected to the node 968b, and the gate 996b of N channel output transistor 990b is connected to the node 978b. The P channel output transistor 980b is connected to the supply voltage VDDIO, and the N channel output transistor 990b is connected to the ground reference voltage GND.

As the capacitor pump circuit 934b, the reset voltage source circuits 936c and 936d, the reset circuits 938c and 938d, and the output drive circuit 922b respectively operate exactly the same as the capacitor pump circuit 934a, the reset voltage source circuits 936a and 936b, the reset circuits 938a and 938b, and the output drive circuit 922a, there is no need to repeat that description.

The operation of output driver 900 is like that of output driver 70, shown in FIG. 7A, where the left side of the circuit diagram, drive logic circuit 930a, operates to provide the output at terminal 928 when the CLK signal is high, and the right side of the circuit diagram, drive logic circuit 930b, operates to provide the output at terminal 928 when the CLK_n signal is high. The input logic circuits 932a and 932b differ somewhat from the drive logic sub-system 74 of output driver 70, and therefore we will now look at the operation of the input logic circuits 932a and 932b.

Referring to the timing diagram of FIG. 7B, consider an initial time period where the CLK signal is "high" (a logic 1), the CLK_n signal is "low" (logic 0), and the data signal D is a logic 0. Looking first at the drive logic circuit 930a under these conditions, AND gate 901a has logic 1 at CLK signal input 915 and a logic 0 at the data input 916, and thus has a logic 0 at the output 905a connected to node 909a, and thereby to inverter circuit 921a, which in turn provides the VDD potential to the first capacitor terminal 935a. As the node 909a is low (ground reference voltage level), that voltage on the gate 966a via the node 909a turns ON reset transistor 960a, supplying the voltage Vc_a, a positive voltage output at the terminal 955a of DAC 953a, such as VDDIO or some other positive voltage that, under control of a processor (located on or off the chip and not shown), can provide compensation for ambient environmental conditions and/or a circuit tolerance variation determined during initial chip testing. Under these conditions, the P channel output transistor is held in an OFF state. As noted, the CLK_n signal input 917, at this time, is a logic 0 and is one of the inputs of OR gate 903a, and the other input is the data signal D, which is also logic 0 at the input 916. Accordingly, the OR gate output 907a connected to node 911a is a logic 0, and the inverter circuit 923a then outputs a logic 1, the voltage VDD, to the terminal 945a of the capacitor 941a. The logic 0 on node 911a holds the N channel reset transistor OFF, and as was explained with respect to the output driver 800 of FIG. 8, the output terminal 943a of capacitor 941a must therefore be at the same potential as the terminal 945a, which is VDD. Hence, the gate 996a of the N channel output transistor 990a is positive with respect to the source 972a and transistor 990a turns on, to connect the nodes 988a and 988c to the ground reference potential and providing a logic 0 at the output terminal 928 through the impedance matching resistor 926.

Now looking at the drive logic circuit 930b during this same time period, both CLK and data (D) inputs 916 and 917 of AND gate 901b are logic 0, and therefore the output 905b thereof provides a logic 0 to node 909b. The output of inverter circuit 921b will be a logic 1, to thereby set the voltage of terminal 935b of capacitor 931b to VDD, and as node 909b is LOW and so is the gate 966 of P channel reset transistor 960b, turning that transistor ON. As previously discussed for the voltage Vc_a, the voltage Vc_b output by the DAC 953b may be VDDIO or some other positive voltage that can provide compensation for ambient environmental conditions and/or a circuit tolerance variation determined during initial chip testing. With the P channel reset transistor turned ON, the voltage Va_b connected to the source 962b is switched to the drain 964b and thereby to the node 968b. The voltage Va_b at node 968b and the gate 986b of the P channel output transistor 980b will be the voltage Vc_b, thereby holding the output transistor 980b OFF.

During this time period, the OR gate 903b has one input with a logic 1 from the CLK signal input 915 and a logic 0 at the other input from the data signal input 916. Thus, the OR gate 903b output 907b to node 911b is a logic 1, and that is the input to inverter circuit 923b, which in turn outputs a logic 0 to the terminal 945b of capacitor 941b. As node 911b is a logic 1 (VDD), the gate 976b of N channel reset transistor 970b if HIGH and reset transistor 970b is thereby turned ON to supply the voltage Vd_b to the node 978b. Like the voltage Vd_a, the voltage Vd_b output by DAC 957b may be the ground reference voltage or some negative voltage that provides compensation for ambient environmental conditions or a circuit tolerance variation determined during initial chip testing. The ground reference or negative voltage at node 978b is applied to the gate 996b of the N channel output transistor 990b to hold that transistor in an OFF state. Thus, both the P and N channel transistors 980b and 990b are OFF and only the drive logic circuit 936a controls the output. From this explanation of circuit operation plus that of the other circuit configurations of FIGS. 6A, 7A, and 8, it is easy to see that when the CLK signal is HIGH and the data signal goes to a logic 1, the P channel output transistor 980a is turned ON, the N channel output transistor 99a is OFF and both the P and N channel transistors 980b, 990b are OFF.

Looking now at the time period when the CLK signal is LOW and the CLK_n signal is HIGH and the data signal is a logic 0, we will see how control of the output signal is controlled by the drive logic circuit 936b. With these input conditions, AND gate 901b has a logic 1 and logic 0 inputs ant therefore the output 905b is a logic 0, which is input to the inverter circuit 921b. The output of inverter circuit 921b is a logic 1 (VDD) supplied to the capacitor terminal 935 of capacitor 931b. The logic 0 output of AND gate 901b is coupled to the node 909b, to which the gate 966b is connected turns on the P channel reset transistor 960b to connect the DAC output voltage Vc_b to the node 968b. Thus, the voltage Va_b at node 968b and capacitor terminal 933b is the voltage Vc_b. As the voltage Va_b is greater than VDD, a positive voltage is applied to the gate 986b of the P channel output transistor 980b the P channel output transistor is held in an OFF state.

During this time period, with both the CLK signal being LOW and the data signal being a logic 0, the OR gate 903b, having inputs being respectively connected to signal input 915 and 916, has two logic 0 inputs and thus has a logic 0 at the output 907b coupled to the node 911b. The output of inverter circuit 923b to the capacitor terminal 945b will be a logic 1, and the logic 0 at the node 911, to which the gate 976b of the N channel reset transistor 970b is coupled, will hold transistor 970b in an OFF state. Under these conditions, as was the case with the drive logic circuit 930a, the voltage Vb_b at the capacitor terminal 943b must be equal to the logic 1 voltage on the capacitor terminal 945b. With the voltage Vb_b being at the logic 1 level, and being coupled to the gate 996b of the N channel output transistor 990b, transistor 990b is therefore turned ON to couple the ground reference potential from the source 992b through the drain 994b to the nodes 988b and 988c to the output terminal 928 through the impedance matching resistor 926, and to thereby output a logic 0.

As it should be now clear to one skilled in the art, the operation of the input logic circuits 932a, 932b are complementary to one another, and it should be understood that during the above-mentioned input signal conditions both of the P and N channel output transistors 980a and 990a are held in an OFF state. Now, we will consider another time period when the CLK signal is LOW and the CLK_n signal is HIGH and the data signal is a logic 1.

Under these input signal conditions, with the OR gate 903b having inputs connected to the CLK input 915 and the data input 916, it has one input at a logic 0 and the other at a logic 1. Therefore, the output 907b of OR gate 903b must be a logic 1 that is supplied to the node 911b and inverter circuit 923b. The inverter circuit 923b provides a logic 0 voltage level (GND) to the capacitor terminal 945b of capacitor 941b. The logic 1 at node 911b, to which the gate 976b of the N channel reset transistor 970b is connected, turns ON transistor 970b to supply the Vd_b voltage to the node 978b, so that the voltage Vb_b is now equal to the Vd_b voltage. The voltage Vd_b, output by DAC 957b, is the voltage that may be the ground reference potential or a negative voltage, as determined from the digital input provided by a processor (not shown). As the voltage Vb_b is at the GND potential or negative with respect to the ground reference and supplied to the gate 996b of the N channel output transistor 990b, output transistor 990b is held in an OFF state.

With the inputs of AND gate 901b being respectively coupled to the data input 916 and the CLK_n input 917, both inputs are at the logic 1 level and therefore, the output 905b is likewise a logic 1 and supplied to the node 909b and the input to inverter circuit 921b. Inverter circuit 921b outputs a logic 0 to the capacitor terminal 935b of capacitor 931b. The logic 0 supplied to the capacitor terminal 935b only occurs when both the CLK_n and data signals are HIGH (logic 1). At all other times the capacitor terminal 935b is a logic 1. Since at this time the voltage across the capacitor changes negatively, going down from VDD to GND, the voltage other capacitor terminal, the voltage Va_b supplied to the gate 986b of the P channel output transistor goes to Vc_b-Va_b, which may be VDDIO-VDD, which is a negative voltage, or some other negative voltage dependent on the value of Vc_b set by DAC 953b. The negative gate voltage, being greater (more negative) than the turn ON threshold gate voltage, strongly turns ON the P channel output transistor 980b to thereby supply the VDDIO voltage from the source 982b to drain 984b and then to nodes 988b and 988c and through the impedance matching resistor 926 to output terminal 928, and thereby a logic 1 is output.

Noting that the input logic circuits 932a and 932b are complementary to one another, and with the CLK signal being LOW and the CLK_n and data signals being HIGH, both output transistors 980a and 990a are held in an OFF state. Likewise, when the CLK and data signals are HIGH and the CLK_n is LOW, both of the output transistors 980b and 990b are held in an OFF state and the capacitor pump circuit 934a operates just as described above to strongly turn on the P channel output transistor 980a to provide a logic 1 at the output terminal 928.

In addition to the capacitor pump circuit 56, 102, 202, 534, 834, 934a, and 934b in the output driver circuits 30, 70, 500, 800, and 900 assuring a sufficient turn ON the P channel output transistors P1, P1a, P1b, 880, 980a, and 980b in the output drivers, of FIGS. 5, 6A, 7A, 8, and 9, another reason to control the gate drive is to control the output impedance of a drive unit. The prior art method of controlling the output impedance by adjusting the number of units used in parallel can be replaced by using one large unit and a controlled the drive voltage to each of the two output transistors, as is done in the output drivers of FIGS. 5, 8 and 9. Using the output driver of FIG. 8 as an example and as was previously explained, voltage Va will swing from a high voltage of Vc to a low voltage of Vc-VDD. Likewise, Vb will swing from a low voltage of Vd to a high voltage of Vd+VDD. Voltages Vc and Vd are supplied by DACs 853 and 857. As previously noted, the required current from the DACs is only leakage of the devices connected to the output, so simple low power DACs are sufficient for the output drivers disclosed herein.

By controlling the impedance of the output transistors 880, 980a, 980b, 890, 990a, and 990b, the output impedance can be controlled for process, voltage, and temperature variation. This allows the use of smaller output resistors 826 and 926, since it is not needed to swamp out the drift of the transistors. While eliminating the resistors 826 and 926 may not be possible, due to electrostatic discharge (ESD) and linearity requirements, a 3 times or more reduction is achievable. Even larger savings result from the output transistors being allocated a larger fraction of the output impedance budget, since their width can be directly reduced as the impedance they contribute increases. This saves both area and drive power from reduced gate capacitance. The resistance of the metal-oxide semiconductor field-effect transistor (MOSFET) is proportional to its Length/Width where Length is the distance from source to drain and the Width is how wide the source and drains are. In FinFET processes, the width of the transistor is effectively the number of fingers used. A lower resistance for the MOSFET means a larger width (a greater number of fingers) since the length is already at a process minimum. Thus, the higher the allowed resistance in the MOSFETs, the smaller they are.

For an example of the savings, the traditional combined group of output units would result in a net output resistor value of 37.5 Ohms and an output transistor impedance of 12.5 Ohms to create an output impedance of 50 Ohms and desensitize by a factor of 4 to the effects of process, voltage, and temperature. With the techniques disclosed herein, the resistance of the output resistors 826 and 926 can be reduced to a single 12.5 Ohm resistor and the ON resistance of the output transistors 880, 980a, 980b, 890, 990a, and 990b can be raised to 37.5 Ohms. This results in the reduction of the size of the output drive transistors by 3 times, saving power and chip area, and the elimination of the need to break the output stage into units also saving chip/circuit board area and power.

To achieve the impedance control, DACs 853, 953a, and 953b need an extended output range above VDDIO, and may need a range above VDD in some cases. Due to the very low current requirements at its output (leakage only), the simple capacitive pump disclosed herein easily serves this need. The DACs 857, 957a, and 957b output range needs to extend below ground. Again, the minimal drive requirements (leakage only) also allow this to be achieved with the simple capacitive charge pump disclosed herein.

Similar to the P channel only capacitively coupled output stage of FIG. 7A, the output driver of FIG. 9 needs additional drive circuitry for applications where the data is not coded to ensure transitions, but additionally capacitively couples both the P channel and the N channel output transistors. In FIG. 9, the left side drive circuit 930a is active when the CLk signal is HIGH and the CLK_n signal is LOW. The right side drive circuit 930b is active when the CLK signal is LOW and the CLK_n signal is HIGH. These clock signals do not need to be synchronized to the data in any fashion, but the CLK signal and the CLK_n signal should overlap HIGH so that at least one of the two output paths are always active. If both were low, the output would be invalid for that period. The overlap time needs to be only long enough to cover for alignment and rise/fall times of the CLK and CLK_n signals.

It should be noted that in use upon a "cold start" (an initial power up condition) the first bit transmitted may have incorrect drive levels, due to there being no prior circuit operation to initially charge the capacitor(s) of the of the capacitor pump circuit. This is not a practical problem in that the startup of data links always has additional patterns for alignment, calibration, and/or synchronization which precede data transmission. This does not occur again as long as the link remains powered up.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of elements, steps, or processes may be reversed or interposed, all without departing from the spirit or scope of the invention as defined in the appended claims.

What is claimed is:

1. A serial data link output driver having serial data input and serial data output terminals, the serial data link output driver comprising:
    an input logic circuit having at least one input terminal coupled to the serial data link output driver input terminal for receiving serial data signal therefrom;
    a first output drive circuit including at least one pair of first N and P channel transistors coupled drain terminal to drain terminal, each drain terminal of the at least one pair of first N and P channel transistors being coupled to the serial data link output driver output terminal;
    a second output drive circuit including a second P channel output transistor, the second P channel output transistor having a gate terminal and a drain terminal, the drain terminal of the second P channel output transistor being coupled to the serial data link output driver output terminal;
    a capacitor pump circuit having at least one input terminal coupled to an output terminal of the input logic circuit, the capacitor pump circuit including at least one pair of capacitors, each capacitor of the at least one pair of capacitors having a first terminal coupled to a corresponding output terminal of the input logic circuit for establishing a reference voltage for each capacitor, at least one capacitor of the at least one pair of capacitors having a second terminal coupled to a gate terminal of the second P channel transistor of the second output drive circuit; and
    at least one reset circuit having an input terminal coupled to the input logic circuit and having an output terminal coupled to the second terminal of the at least one capacitor of the at least one pair of capacitors of the capacitor pump circuit, the reset circuit being configured to charge the at least one capacitor to a voltage and polarity sufficient to hold the second P channel transistor in an off state in correspondence with a logic level of the serial data input,
    wherein a change in the logic level of the serial data input switches the at least one reset circuit to an off state and changes the reference voltage of the first terminal of the at least one capacitor of the at least one pair of capacitors of the capacitor pump circuit from one logic level to another, thereby changing the reference voltage for the at least one capacitor to correspondingly change a magnitude of a voltage applied to the gate terminal of the second P channel transistor to exceed a gate threshold turn on voltage thereof, to turn on and output a logic signal to the serial data link output driver output terminal, and
    wherein the input logic circuit is configured to alternately drive the first and second output drive circuits in correspondence with two oppositely phased clock signals having overlapping high logic levels for a predetermined time period.

2. A serial data link output driver having serial data input and serial data output terminals, the serial data link output driver comprising:
    an input logic circuit having at least one input terminal coupled to the serial data link output driver input terminal for receiving serial data signal therefrom;
    a capacitor pump circuit including at least one pair of capacitors, each capacitor of the at least one pair of capacitors having at least one first terminal coupled to a corresponding output terminal of the input logic circuit for establishing a reference voltage for each capacitor;
    a first output drive circuit including at least a first P channel output transistor having a gate terminal, a drain terminal coupled to the serial data link output driver output terminal, and a source terminal coupled to a first voltage source having an output voltage corresponding to at least a voltage of a logic one output of the serial data link output driver, the at least one output drive circuit further including at least a first N channel output transistor having a gate terminal, a drain terminal coupled to the serial data link output driver output terminal in common with the drain terminal of the first P channel transistor, and a source terminal coupled to a second voltage source, the gate terminal of at least one of the first P channel output transistor and the first N channel output transistor being coupled to a second terminal of a corresponding capacitor of the at least one pair of capacitors of the capacitor pump circuit;
    a second output drive circuit including at least a second P channel output transistor having a gate terminal and a drain terminal, the drain terminal of the second P channel output transistor being coupled to the serial data link output driver output terminal, the gate terminal of the second P channel output transistor being coupled to a second terminal of a corresponding capacitor of the at least one pair of capacitors of the capacitor pump circuit; and
    at least one reset circuit having an input terminal coupled to the input logic circuit and having an output terminal coupled to the second terminal of the capacitor corresponding to the second P channel output transistor, the at least one reset circuit being configured to charge the corresponding capacitor to a voltage and polarity sufficient to hold the second P channel output transistor in an off state in correspondence with a logic level of the serial data input,
    wherein a change in the logic level of the serial data input switches the at least one reset circuit to an off state and changes the reference voltage of the first terminal of the at least one capacitor of the at least one pair of capacitors of the capacitor pump circuit from one logic level to another, thereby changing a magnitude of a voltage applied to the gate terminal of the second P channel transistor to exceed a gate threshold turn on voltage thereof, to turn on the second P channel output transistor and output a logic signal to the serial data link output driver output terminal, and
    wherein the input logic circuit is configured to alternately drive the first and second output drive circuits in correspondence with two oppositely phased clock signals having overlapping high logic levels for a predetermined time period.

3. The serial data link output driver of claim 2, wherein the gate terminal of the first P channel output transistor of the first output drive circuit is coupled to a second terminal of a first capacitor of the at least one pair of capacitors of the capacitor pump circuit, and the first N channel output transistor of the first output drive circuit is coupled to a second terminal of a second capacitor of the at least one pair of capacitors of the capacitor pump circuit.

4. The serial data link output driver of claim 2, wherein the at least one reset circuit includes a P channel transistor switch having:
    a gate terminal coupled to the input logic circuit,
    a source terminal coupled to a positive voltage source, and a drain terminal coupled to the second terminal of at least one capacitor of the at least one pair of capacitors of the capacitor pump circuit.

5. The serial data link output driver of claim 3, wherein the at least one reset circuit comprises:
at least one P channel transistor switch having:
a gate terminal coupled to the input logic circuit,
a source terminal coupled to a first voltage source, and
a drain terminal coupled to the second terminal of the first capacitor of the at least one pair of capacitors of the capacitor pump circuit; and
at least one N channel transistor switch having:
a gate terminal coupled to the input logic circuit,
a source terminal coupled to a second voltage source, where the first voltage source is greater in magnitude than the second voltage source, and
a drain terminal coupled to the second terminal of the second capacitor of the at least one pair of capacitors of the capacitor pump circuit.

6. The serial data link output driver of claim 2, wherein the at least one reset circuit includes a pair of P channel transistor switches each having:
a gate terminal coupled to the input logic circuit,
a source terminal coupled to a positive voltage source, and
a drain terminal coupled to the second terminal of a corresponding capacitor of the at least one pair of capacitors of the capacitor pump circuit.

7. The serial data link output driver of claim 3,
wherein the second output drive circuit further includes a second N channel output transistor having a gate terminal and a drain terminal, the drain terminal of the second N channel output transistor being coupled to the serial data link output driver output terminal, and
wherein the at least one pair of capacitors of the capacitor pump circuit includes a first pair of capacitors and a second pair of capacitors, a first capacitor of the second pair of capacitors having a second terminal coupled to the gate terminal of the second P channel output transistor, a second capacitor of the second pair of capacitors having a second terminal coupled to the gate terminal of the second N channel output transistor.

8. The serial data link output driver of claim 2, wherein the serial data link output driver is formed on an integrated circuit chip and further comprises at least one reset voltage source circuit, the at least one reset circuit being coupled to the at least one reset voltage source circuit, the at least one reset voltage source circuit being configured to output a voltage equal to a chip supply voltage.

9. The serial data link output driver of claim 2, wherein the serial data link output driver is formed on an integrated circuit chip and further comprises at least one reset voltage source circuit, the at least one reset circuit being coupled to the at least one reset voltage source circuit, the at least one reset voltage source circuit being configured to output a voltage selected to compensate for at least one of circuit tolerance variations, ambient conditions, and output impedance of the at least one output drive circuit.

10. The serial data link output driver of claim 9, wherein the at least one reset voltage source circuit includes a digital to analog converter having an output terminal coupled to the at least one reset circuit and an input terminal for receiving a digital representation of a voltage to be output by the digital to analog converter to the at least one reset circuit.

11. A method of driving an output stage of a serial data link output driver having a pair of first P and N channel output transistors and a second P channel output transistor, each transistor of the pair of first P and N channel output transistors having drain terminals commonly coupled to an output terminal of the serial data link output driver, the second P channel output transistor having a drain terminal coupled to an output terminal of the serial data link output driver, the method comprising:
providing a capacitor pump circuit including at least one pair of capacitors, each capacitor of the at least one pair of capacitors having a first terminal coupled to a corresponding output terminal of an input logic circuit, the capacitor pump circuit being configured for establishing a logic level voltage on the first terminal of at least one capacitor of the at least one pair of capacitors, the established logic level voltage corresponding to an opposing logic level to that of an input data bit, a second terminal of the at least one capacitor being coupled to a gate terminal of the second P channel output transistor, the capacitor pump circuit being further configured for establishing a voltage and polarity on the second terminal of the at least one capacitor relative to the first terminal sufficient to hold the second P channel output transistor in an off state; and
driving, by the input logic circuit, the pair of first P and N channel output transistors alternatingly with the second P channel output transistor in correspondence with two oppositely phased clock signals having overlapping high logic levels for a predetermined time period,
wherein, responsive to another input data bit having an opposing logic level, the logic level on the first terminal of the at least one capacitor of the at least one pair of capacitors of the capacitor pump circuit changes and thereby changes a magnitude of a voltage of the second terminal of the at least one capacitor relative to the first terminal thereof to a second voltage, the second voltage exceeding a gate threshold turn on voltage of the second P channel output transistor.

12. The method of claim 11, wherein establishing a voltage and polarity on the second terminal of the at least one capacitor relative to the first terminal sufficient to hold the second P channel output transistor in an off state includes providing a reset circuit to supply the voltage to the second terminal of the at least one capacitor in correspondence with a certain logic level of an input data bit.

13. The method of claim 12, wherein providing a reset circuit includes connecting the reset circuit to a reset voltage source circuit configured to output a voltage selected to compensate for at least one of circuit tolerance variations, ambient conditions, and output impedance of the output stage of the serial data link output driver.

14. The method of claim 13, wherein connecting the reset circuit to a reset voltage source circuit includes establishing an adjustable voltage source including a digital to analog circuit to output the selected voltage to the second terminal of the at least one capacitor responsive to a digital signal input thereto.

15. A serial data link output driver having serial data input and serial data output terminals, and further having first and second output drive circuits each having a pair of P and N channel output transistors, each of the P and N channel output transistors of the first output drive circuit having drain terminals commonly coupled to an output terminal of the serial data link output driver, each of the P and N channel output transistors of the second output drive circuit having drain terminals commonly coupled to the output terminal of the serial data link output driver, the serial data link output driver comprising:

an input logic circuit having at least one input terminal coupled to the input terminal of the serial data link output driver for receiving serial data signal therefrom;
at least one reset circuit having an input terminal coupled to an output terminal of the input logic circuit and an output terminal coupled to a gate terminal of at least one transistor of the pair of P and N channel output transistors of at least one output drive circuit of the first and second output drive circuits, the at least one reset circuit being configured to output a voltage and polarity thereof sufficient to hold the at least one transistor in an off state in correspondence with a logic level of the serial data input, the at least one reset circuit being inhibited from output of a voltage in correspondence with an opposing logic level of the serial data input; and
a capacitor pump circuit having an input terminal thereof coupled to another output terminal of the input logic circuit and an output terminal thereof coupled to the gate terminal of the at least one transistor of the pair of P and N channel output transistors of the at least one output drive circuit, the capacitor pump circuit being configured to capacitively store the voltage outputted by the at least one reset circuit relative to a logic level voltage of the other output terminal of the input logic circuit, the capacitor pump circuit including at least one pair of capacitors, each capacitor of the at least one pair of capacitors having a first terminal coupled to an output terminal of the input logic circuit, at least one capacitor of the at least one pair of capacitors having a second terminal coupled to the gate terminal of the P channel output transistor of the second output drive circuit,
wherein, in correspondence with the inhibited output of the at least one reset circuit, the logic level voltage of the other output terminal of the input logic circuit changes to an opposing logic level to thereby change a reference of the stored voltage and thereby establish a gate voltage of the at least one of the P and N channel output transistors of the one pair of P and N channel output transistors that exceeds a gate threshold turn on voltage thereof, and
wherein the input logic circuit is configured to alternately drive the first and second output drive circuits in correspondence with two oppositely phased clock signals having overlapping high logic levels for a predetermined time period.

16. The serial data link output driver of claim 15, wherein the at least one reset circuit is coupled to a reset voltage source, which is configured to output a voltage selected to hold the at least one transistor of the P and N channel output transistors of the at least one output drive circuit of the first and second output drive circuits in an off state and compensate for at least one of circuit tolerance variations, ambient conditions, and output impedance of the output drive circuit of the serial data link output driver.

17. The serial data link output driver of claim 15, further comprising a reset voltage source which includes a digital to analog converter having an input terminal for receiving a digital representation of a selected voltage.

* * * * *